(12) United States Patent
Choe et al.

(10) Patent No.: US 8,513,729 B2  
(45) Date of Patent: Aug. 20, 2013

(54) VERTICAL STRUCTURE NONVOLATILE MEMORY DEVICES

(75) Inventors: Byeong-in Choe, Yongin-si (KR);  
Sung-il Chang, Hwaseong-si (KR);  
Chang-seok Kang, Seongnam-si (KR);  
Jin-soo Lim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 139 days.

(21) Appl. No.: 13/152,684

(22) Filed: Jun. 3, 2011

(65) Prior Publication Data

US 2011/0298037 A1 Dec. 8, 2011

(30) Foreign Application Priority Data

Jun. 3, 2010 (KR) .................. 10-2010-0052366

(51) Int. Cl.
*H01L 29/792* (2006.01)
*H01L 29/78* (2006.01)

(52) U.S. Cl.
USPC .......................................... 257/324

(58) Field of Classification Search
USPC .................. 257/314–326, E27.078, 301, 303, 257/286, 302, E29.3–29.309, 225–234, E27.076, 257/390; 438/954
See application file for complete search history.

(56) References Cited

U.S. PATENT DOCUMENTS

| | | | |
|---|---|---|---|
| 7,253,467 B2 * | 8/2007 | Lee et al. | 257/315 |
| 7,256,141 B1 * | 8/2007 | Ramsbey et al. | 438/761 |
| 2011/0024818 A1 * | 2/2011 | Ahn | 257/314 |

FOREIGN PATENT DOCUMENTS

| | | |
|---|---|---|
| JP | 2007-180389 | 7/2007 |
| JP | 2009-088533 | 4/2009 |
| KR | 1020090047614 A | 5/2009 |
| KR | 1020090093770 A | 9/2009 |

* cited by examiner

*Primary Examiner* — Dao H Nguyen  
*Assistant Examiner* — Tram H Nguyen  
(74) *Attorney, Agent, or Firm* — Myers Bigel Sibley & Sajovec, P.A.

(57) ABSTRACT

A vertical structure nonvolatile memory device can include a channel layer that extends in a vertical direction on a substrate. A memory cell string includes a plurality of transistors that are disposed on the substrate in the vertical direction along a vertical sidewall of the channel layer. At least one of the plurality of transistors includes at least one recess in a gate of the transistor into which at least one protrusion, which includes the channel layer, extends.

20 Claims, 24 Drawing Sheets

VERTICAL STRUCTURE NONVOLATILE MEMORY DEVICES

CROSS-REFERENCE TO RELATED APPLICATIONS

This application claims the benefit of Korean Patent Application No. 10-2010-0052366, filed on Jun. 3, 2010, in the Korean Intellectual Property Office, the disclosure of which is incorporated herein in its entirety by reference.

BACKGROUND

The inventive concept relates to nonvolatile memory devices, and more particularly, to nonvolatile memory devices having a vertical channel structure.

Electronic appliances are becoming smaller in size, while maintaining high data throughput. Non-volatile memory devices may use a vertical transistor structure to increase integration levels.

SUMMARY

Embodiments according to the inventive concept can provide vertical structure nonvolatile memory devices. Pursuant to these embodiments, a vertical structure nonvolatile memory device can include a channel layer that extends in a vertical direction on a substrate. A memory cell string includes a plurality of transistors that are disposed on the substrate in the vertical direction along a vertical sidewall of the channel layer. At least one of the plurality of transistors includes at least one recess in a gate of the transistor into which at least one protrusion, which includes the channel layer, extends.

In some embodiments according to the inventive concept, the plurality of transistors of the memory cell string can include a plurality of memory cell transistors, and at least one selection transistor that is disposed at one end, or at both ends, of the memory cell string. In some embodiments according to the inventive concept, the at least one recess and at least one protrusion are included in the at least one selection transistor. In some embodiments according to the inventive concept, an entire width of the channel layer protrudes into the recess and is conformally on a surface of the recess. In some embodiments according to the inventive concept, the at least one protrusion only protrudes into a middle region of the gate between uppermost and lowermost surfaces of the gate adjacent to respective interlayer insulating layers.

In some embodiments according to the inventive concept, the recess has a vertical dimension that is greater than all of a remaining vertical dimension of the gate outside the recess. In some embodiments according to the inventive concept, the at least one recess and the at least one protrusion includes first and second recesses and first and second protrusions that are disposed in first and second regions of the gate.

In some embodiments according to the inventive concept, the structure can also include a first interlayer insulating layers located between immediately adjacent gates. A second interlayer insulating layer can be in the recess between a gate electrode of the gate and the channel the channel layer. In some embodiments according to the inventive concept, the second interlayer insulating layer is between the channel layer and the gate electrode and has an etch selectivity that is different from that of the first interlayer insulating layers.

In some embodiments according to the inventive concept, the first interlayer insulating layers are recessed from sides of the gates adjacent to the channel layer, in the same direction as the direction in which the at least one protrusion extends into the recess. In some embodiments according to the inventive concept, the gate can include a tunneling insulating layer, a charge storage layer and a blocking insulating layer that are sequentially stacked on the channel layer and a gate electrode In some embodiments according to the inventive concept, a vertical structure nonvolatile memory device can include a plurality of transistors in a memory cell string, where each includes a respective gate electrode. A recess can be included in at least one of the gate electrodes to define a portion of a non-planar surface of the at least one gate electrode. A channel layer can protrude into the recess and is conformally on the portion of the non-planar surface. In some embodiments according to the inventive concept, the at least one of the gate electrodes is only first and second selection transistors at both ends of the memory cell string.

In some embodiments according to the inventive concept, the recess is a first recess and the portion is a first portion where the device further includes a second recess in the least one of the gate electrodes including the at least one recess that defines a second portion of the non-planar surface therein. The channel layer protrudes into the second recess and is conformally on the second portion of the non-planar surface.

In some embodiments according to the inventive concept, a system can include a memory that includes a vertical structure nonvolatile memory device which can include a plurality of transistors in a memory cell string, where each includes a respective gate electrode. A recess can be included in at least one of the gate electrodes to define a portion of a non-planar surface of the at least one gate electrode. A channel layer can protrude into the recess and can be conformally on the portion of the non-planar surface. The system can further include a processor configured to communicate with the memory via a bus and an input/output unit that can be configured to communicate with the bus.

DESCRIPTION OF EMBODIMENTS ACCORDING TO THE INVENTIVE CONCEPT

Figure 1:
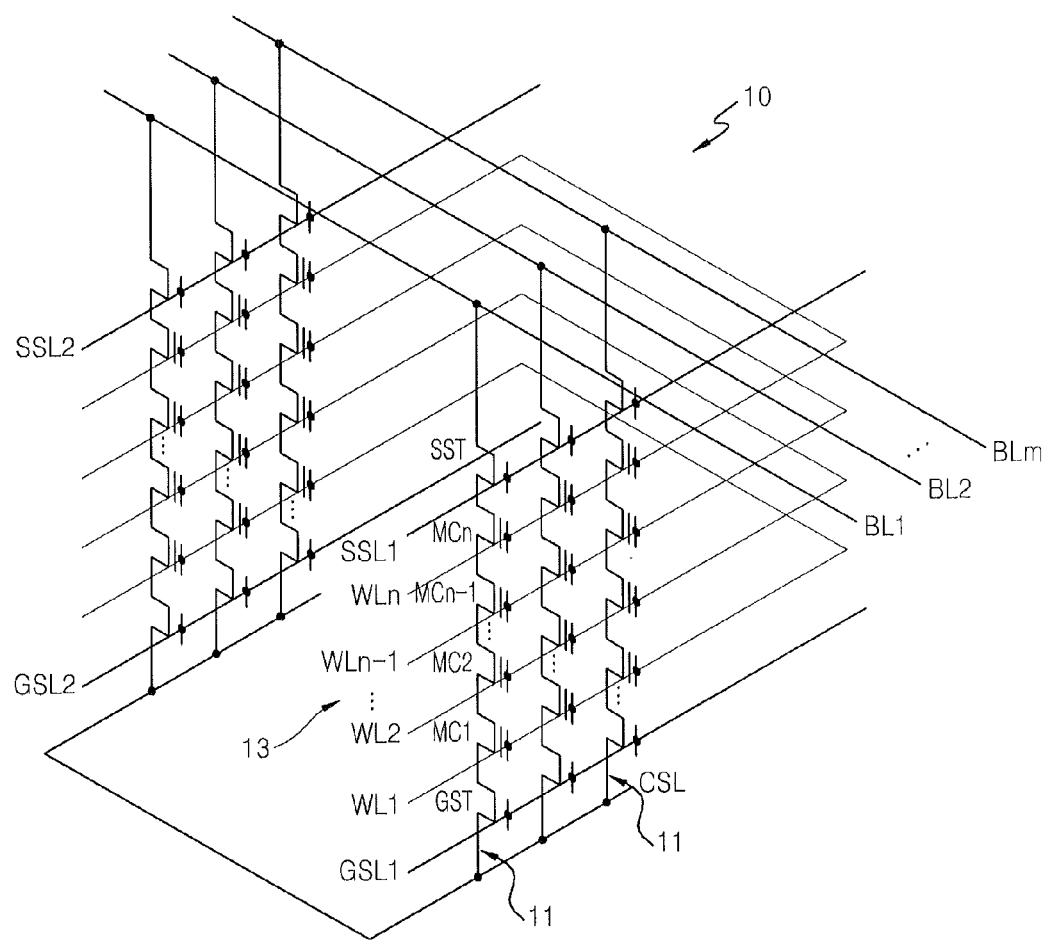
FIG. 1 is an equivalent circuit diagram of a memory cell array of a nonvolatile memory device in some embodiments according to the inventive concept.

The inventive concept will now be described more fully with reference to the accompanying drawings, in which exemplary embodiments of the invention are shown.

This invention may, however, be embodied in many different forms and should not be construed as limited to the exemplary embodiments set forth herein. Rather, these embodiments are provided so that this disclosure will be thorough and complete, and will fully convey the scope of the invention to those of ordinary skill in the art.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. In the drawings, lengths and sizes of layers and regions may be exaggerated for clarity. Like reference numerals refer to like elements throughout. As used herein, the term "and/or" includes any and all combinations of one or more of the associated listed items.

The terms used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Embodiments of the invention are described herein with reference to illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Hereinafter, embodiments of vertical structure nonvolatile semiconductor memory devices according to the inventive concept will be described with reference to nonvolatile NAND flash memory devices. Vertical structure nonvolatile memory devices can retain stored data even when power is not supplied.

FIG. 1 is an equivalent circuit diagram of a memory cell array of a nonvolatile memory device in some embodiments according to the inventive concept.

Referring to FIG. 1, the memory cell array 10 includes a plurality of memory cell strings 11. Each memory cell string 11 may have a vertical structure extending substantially perpendicular to a main surface of a substrate. The plurality of memory cell strings 11 may constitute a memory cell block 13.

Each of the plurality of memory cell strings 11 includes a plurality of memory cells MC1-MCn, a string selection transistor SST, and a ground selection transistor GST. The ground selection transistor GST, the memory cells MC1-MCn, and the string selection transistor SST of each of the memory cell strings 11 may be serially arranged in a vertical direction. The plurality of memory cells MC1-MCn may store data. A plurality of word lines WL1-WLn are connected to the memory cells MC1-MCn, respectively, to control the memory cells MC1-MCn. The number of memory cells MC1-MCn may vary according to the capacity of the nonvolatile memory device.

The memory cell strings 11 are respectively arranged in $1^{st}$-$m^{th}$ columns of the memory cell block 13. One end of each of the memory cell strings 11, for example drain sides of the respective string selection transistors SST, may be respectively coupled to a plurality of bit lines BL1-BLm. The other end of each of the memory cell strings 11, for example source sides of the ground selection transistors GST, may be coupled to a common source line CSL.

A plurality of word lines WL1-WLn may be respectively coupled to rows of the memory cells MC1-MCn of the plurality of memory cell strings 11. Data may be written to or may be read (or erased) from the plurality of memory cells MC1-MCn upon activation of the word lines WL1-WLn.

The string selection transistors SST of the memory cell strings 11 may be arranged between the corresponding bit lines BL1-BLm and the memory cells MC1-MCn. String selection lines SSLs are respectively coupled to the gates of the string selection transistors SST, and thus may control data transfer between the bit lines BL1-BLm and the memory cells MC1-MCn in the memory cell block 13.

The ground selection transistors GST may be arranged between the common source line CSL and the plurality of memory cells MC1-MCn. Ground selection lines GSL are respectively coupled to the gates of the ground selection transistors GST, and thus may control data transfer between the common source line CSL and the memory cells MC1-MCn in the memory cell block 13.

Figure 2:
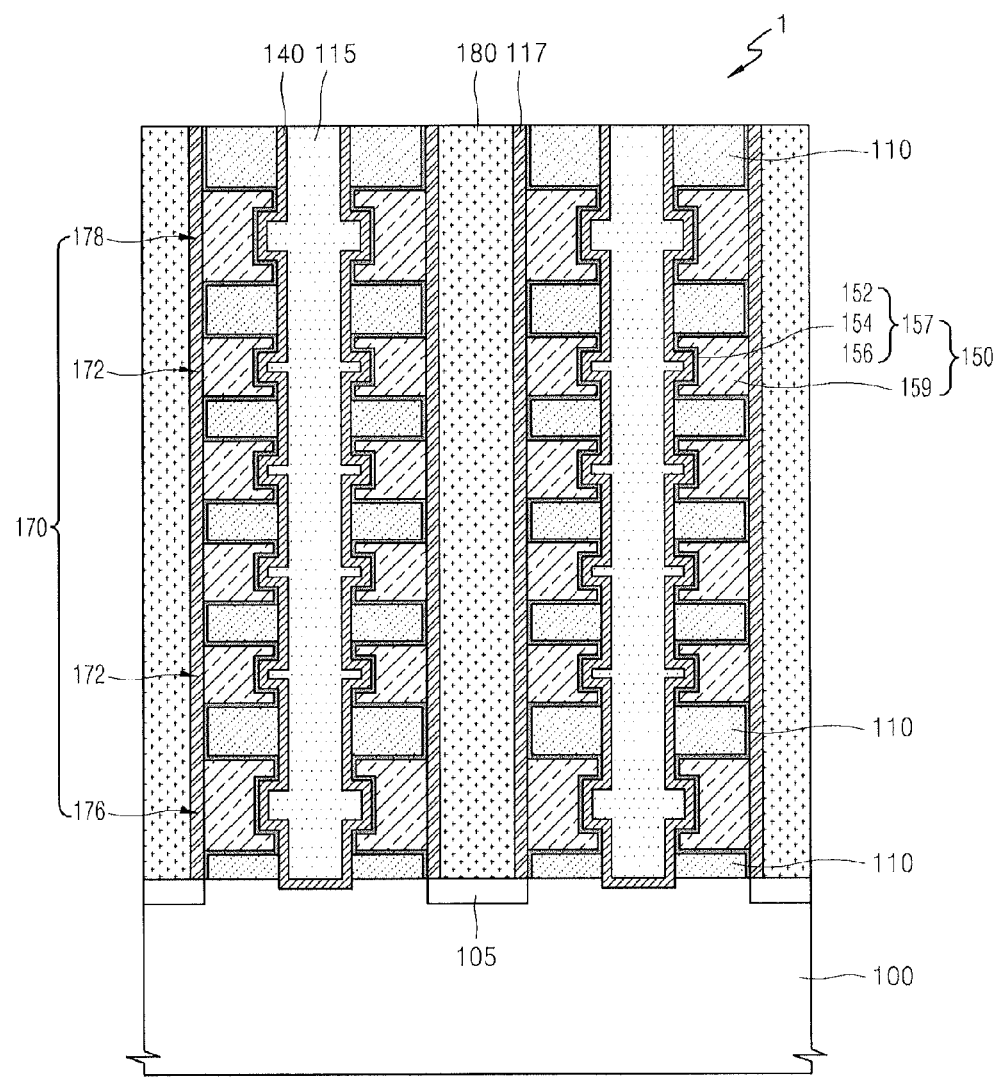
FIG. 2 is a cross-sectional view of a vertical structure nonvolatile memory device in some embodiments according to the inventive concept.

FIG. 2 is a cross-sectional view of a vertical structure nonvolatile memory device in some embodiments according to the inventive concept.

Referring to FIG. 2, the nonvolatile memory device 1 includes a substrate 100 whose main surface extends in a first direction (i.e., an x-axis direction in FIG. 2). The substrate 100 may contain a semiconductor material, for example, a Group IV semiconductor, a Group III-V compound semiconductor, or a Group II-VI oxide semiconductor. Examples of the Group IV semiconductor include silicon, germanium, and silicon-germanium. The substrate 100 may be a bulk wafer or an epitaxial layer.

A channel layer 140, including a protrusion, extends on the substrate 100 in a second direction (i.e., a y-axis direction of FIG. 2) substantially perpendicular to the first direction in which the main surface of the substrate 100 extends. A gate insulating layer 157 is disposed on a portion of the channel layer 140. The channel layer 140 may be in the form of an annular pillar filled with a channel hole insulating layer 115.

A plurality of transistors 170 are vertically disposed on an upper surface of the substrate 100 in the second direction (i.e., the y-axis direction of FIG. 2) along the channel layer 140. One channel layer 140 and the plurality of transistors 170, which are disposed in the second direction along the channel layer 140 constitute one of the memory cell strings 11 (see FIG. 1).

Each of the memory cell strings 11 (see FIG. 1) includes a plurality of first transistors 172, which constitute a plurality of memory cells, and second transistors 176 and 178, which constitute selection transistors. In the nonvolatile memory device 10 having the configuration of FIG. 1, the second transistors 176 and 178 of each of the memory cell strings 11 may include one ground selection transistor 176 and one string selection transistor 178.

A bit line may be coupled to the string selection transistor 178, which constitutes the second transistors 176 and 178, as illustrated in FIG. 1. The bit line may extend in a linear pattern in the first direction (the x-axis direction of FIG. 2). The bit line may be coupled to one of the selection transistors 176 and 178, for example, the string selection transistor 178, via a contact.

The channel layers 140 have protrusions extending in the first direction (the x-axis direction in FIG. 2). Gates 150, including the gate insulating layer 157 and a gate electrode 159, have uneven structures conforming to the protrusions of the channel layers 140. As used herein, the term "uneven structure" refers to both a protrusion and a recess having an opposite pattern to the protrusion. The protrusions of the channel layers 140 may be located in the middles of the gates 150, i.e., between upper and lower portions of the gates 150 disposed on the substrate 100 in a vertical direction. The protrusions may have a vertical dimension that is larger than those of upper and lower portions of the gates 150 divided by the protrusions. The protrusions of the channel layers 140 may also extend in a third direction (i.e., a z-axis direction of FIG. 2). The protrusions of the channel layers 140 may have dimensions in the first direction (the x-axis direction of FIG. 2) that are smaller than the dimensions of the transistors 170. The uneven structures of the gates 150 may have any of various lengths and shapes, and are not limited to the exemplary embodiment illustrated in FIG. 2.

It will be understood that the uneven structure can define at least one recess in the surface of the gate 150 where the channel layer 140 conformally protrudes into the recess. The recess, therefore, defines the profile of the gate surface at the channel layer 140 as being non-planar.

The plurality of first transistors 172 among the plurality of transistors 170, which constitute the plurality of memory cells, may respectively include the gates 150, which include the gate insulating layer 157 and the gate electrode 159 sequentially disposed on a sidewall of the channel layers 140.

The selection transistors 176 and 178 among the plurality of transistors 170 may respectively include the gates 150, which include the gate insulating layer 157 and the gate electrode 159 sequentially disposed on the sidewall of the channel layers 140.

The gate insulating layer 157 may have a stack structure in which a tunneling insulating layer 152, a charge storage layer 154 and a blocking insulating layer 156 are sequentially stacked on the sidewall of the channel layers 140 in the order stated.

The tunneling insulating layer 152 may be a single layer or a multi-layer including at least one material selected from the group consisting of silicon oxide ($SiO_2$), silicon nitride ($Si_3N_4$), silicon oxynitride (SiON), hafnium oxide ($HfO_2$), hafnium silicon oxide ($HfSi_xO_y$), aluminum oxide ($Al_2O_3$), and zirconium oxide ($ZrO_2$).

The charge storage layer 154 may be a charge trapping layer or a floating gate conductive layer. When the charge storage layer 154 is a floating gate conductive layer, the charge storage layer 154 may be formed using chemical vapor deposition (CVD). For example, the charge storage layer 154 may be formed by causing a $SiH_4$ or $Si_2H_6$ gas and a $PH_3$ gas to flow by using low-pressure chemical vapor deposition (LPCVD) to deposit polysilicon. When the charge storage layer 154 is a charge trapping layer, the charge storage layer 154 may be formed as a single layer or a multi-layer including at least one material selected from the group consisting of silicon oxide ($SiO_2$), silicon nitride ($Si_3N_4$), silicon oxynitride (SiON), hafnium oxide ($HfO_2$), zirconium oxide ($ZrO_2$), tantalum oxide ($Ta_2O_3$), titanium oxide ($TiO_2$), hafnium aluminum oxide ($HfAl_xO_y$), hafnium tantalum oxide ($HfTa_xO_y$), hafnium silicon oxide ($HfSi_xO_y$), aluminum nitride ($Al_xN_y$), and aluminum gallium nitride ($AlGa_xN_y$). The charge storage layer 154 may include quantum dots or nanocrystals. In this regard, the quantum dots or nanocrystals may include fine particles of a conductor, such as a metal or a semiconductor.

The blocking insulating layer 156 may be formed as a single layer or a multi-layer including at least one material selected from the group consisting of silicon oxide ($SiO_2$), silicon nitride ($Si_3N_4$), silicon oxynitride (SiON), and a high-k dielectric material. The blocking insulating layer 156 may be formed of a higher-k dielectric material than the tunneling insulating layer 152. The higher-k dielectric material may include at least one material selected from the group consisting of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode 159 may be formed as a single layer or a multi-layer including at least one material selected from the group consisting of polysilicon, aluminum (Al), gold (Au), beryllium (Be), bismuth (Bi), cobalt (Co), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr).

Impurity regions 105 may be defined in the upper surface of the substrate 100. The impurity regions 105 may be coupled to the common source line (CSL) 180. The impurity regions 105 may also form PN junctions with other regions of the substrate 100. The length of the common source lines (CSL) 180 in the second direction (the y-axis direction of FIG. 2) are not limited to the exemplary embodiment illustrated in FIG. 2. For example, the common source lines (CSL) 180 may be shorter than those illustrated in FIG. 2. Spacers 117 of an insulating material may be disposed on the sidewalls of the common source lines (CSL) 180.

The channel layers 140 may be sequentially doped with impurities having the same conductivity type to define a series of wells or channels that contribute to the operation of the plurality of memory cells MC1-MCn. In this case, during a writing or reading operation, the memory cells MC1-MCn may be connected via field effect sources/drains. Surfaces of the channel layers 140 between the memory cells MC1-MCn may be turned on using a lateral electric field, i.e., a fringing field, of the gate electrodes 159. This may also apply to the channel layers 140 between the string selection transistors 178, and to the channel layers 140 between the ground selection transistors 176.

Interlayer insulating layers 110 may be disposed on the channel layers 140 between the plurality of transistors 170, including the first transistors 172 and the second transistors 176 and 178.

In the vertical structure nonvolatile memory device 1 according to the current embodiment, the gates 150 are configured to have uneven (or non-planar) structures to increase lengths of the channel layers 140, without increasing transistor size. Thus, reductions in memory cell string current and threshold voltage, may reduce short channel effects in the device.

FIGS. 3 through 10 are cross-sectional views for describing a method of fabricating the nonvolatile memory device 1 of FIG. 2, according to an exemplary embodiment.

Figure 3:
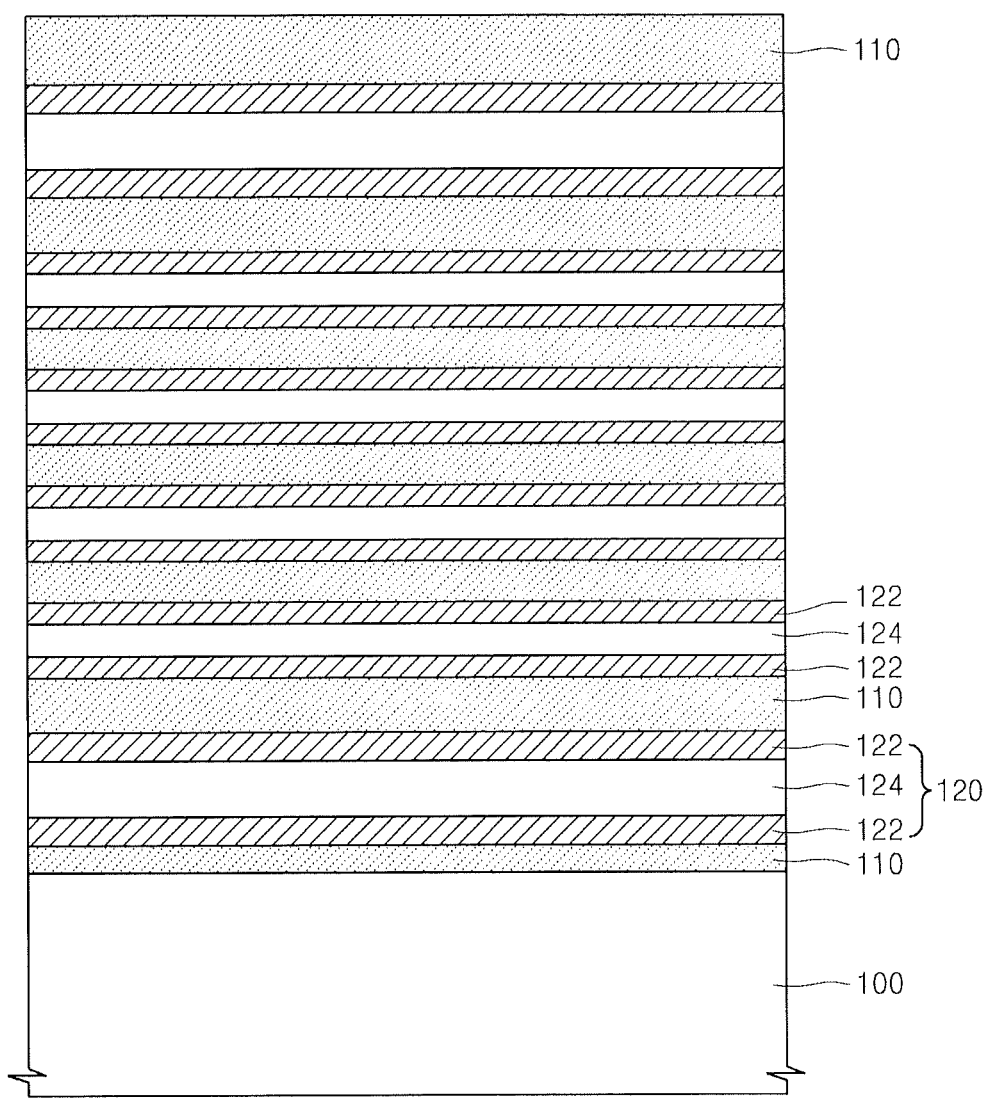
FIGS. 3 through 10 are cross-sectional views describing methods of fabricating the nonvolatile memory device in some embodiments according to the inventive concept.

Referring to FIG. 3, a plurality of interlayer insulating layers 110 and a plurality of sacrificial layers 120 are alternately stacked on the substrate 100. Each of the sacrificial layers 120 includes a first sacrificial layer 124 and two second sacrificial layers 122 stacked respectively on upper and lower surfaces of the first sacrificial layer 124. The interlayer insulating layers 110, the first sacrificial layers 124 and the second sacrificial layers 122 may be formed of materials having different etch selectivity with respect to adjacent sacrificial layers. The etch selectivity may be quantified as an etch rate of one layer to another. In the current embodiment, the interlayer insulating layers 110 and the second sacrificial layers 122 may be formed of materials having an etch selectivity of about 1:10 to about 1:200 with respect to the first sacrificial layers 124. The interlayer insulating layers 110 may be formed of a material having an etch selectivity of about 1:10 to about 1:200 with respect to the second sacrificial layers 122. For example, the plurality of interlayer insulating layers 110 may be formed of a silicon oxide layer. The plurality of first sacrificial layers 124 may be formed of a silicon nitride layer. The plurality of second sacrificial layers 122 may be formed of a silicon carbide layer or an amorphous carbon layer (ACL).

The number of sacrificial layers 120 may be varied according to the memory device to be fabricated. The larger the number of sacrificial layers 120, the more the memory cells per unit area. The thicknesses of the individual interlayer insulating layers 110 and the individual sacrificial layers 120 may not be completely the same. The uppermost interlayer insulating layer among the plurality of interlayer insulating layers 110 may have a thickness larger than the thicknesses of the underlying interlayer insulating layers 110.

Figure 4:
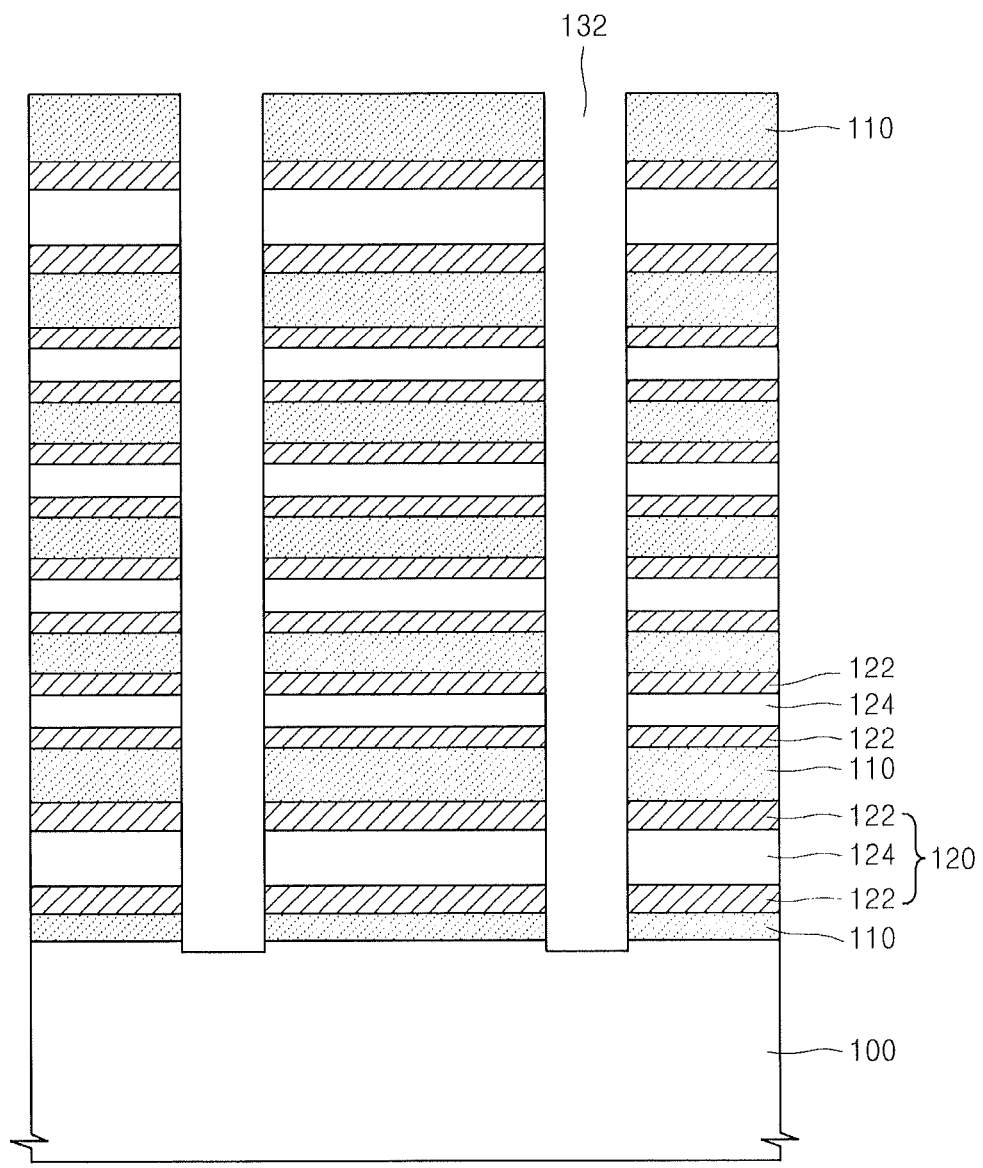

Referring to FIG. 4, the plurality of interlayer insulating layers 110 and the plurality of sacrificial layers 120 may be etched using photolithography to form a plurality of channel holes 132 exposing the substrate 100. The channel holes 132 may be isolated from each other in the first and second directions (the x-axis and y-axis directions of FIG. 2).

Forming the plurality of channel holes 132 may be provided by forming a predetermined mask pattern on the uppermost interlayer insulating layer 110 to define the locations of the channel holes 132, and anisotropically etching the stacked structure, including the interlayer insulating layers 110 and the sacrificial layers 120, by using the mask pattern as an etch mask. Side walls of the plurality of channel holes 132 may not be completely perpendicular to the upper surface of the substrate 100, since the stacked structure includes at least three different kinds of materials layers. For example, the closer to the substrate 100, the smaller the width of the channel holes 132 may be. If the stack structure on the substrate 100 is over-etched during the anisotropic etching process to define the channel holes 132, the upper surface of the substrate 100 may be recessed to a predetermined depth, as illustrated in FIG. 4.

Figure 5:
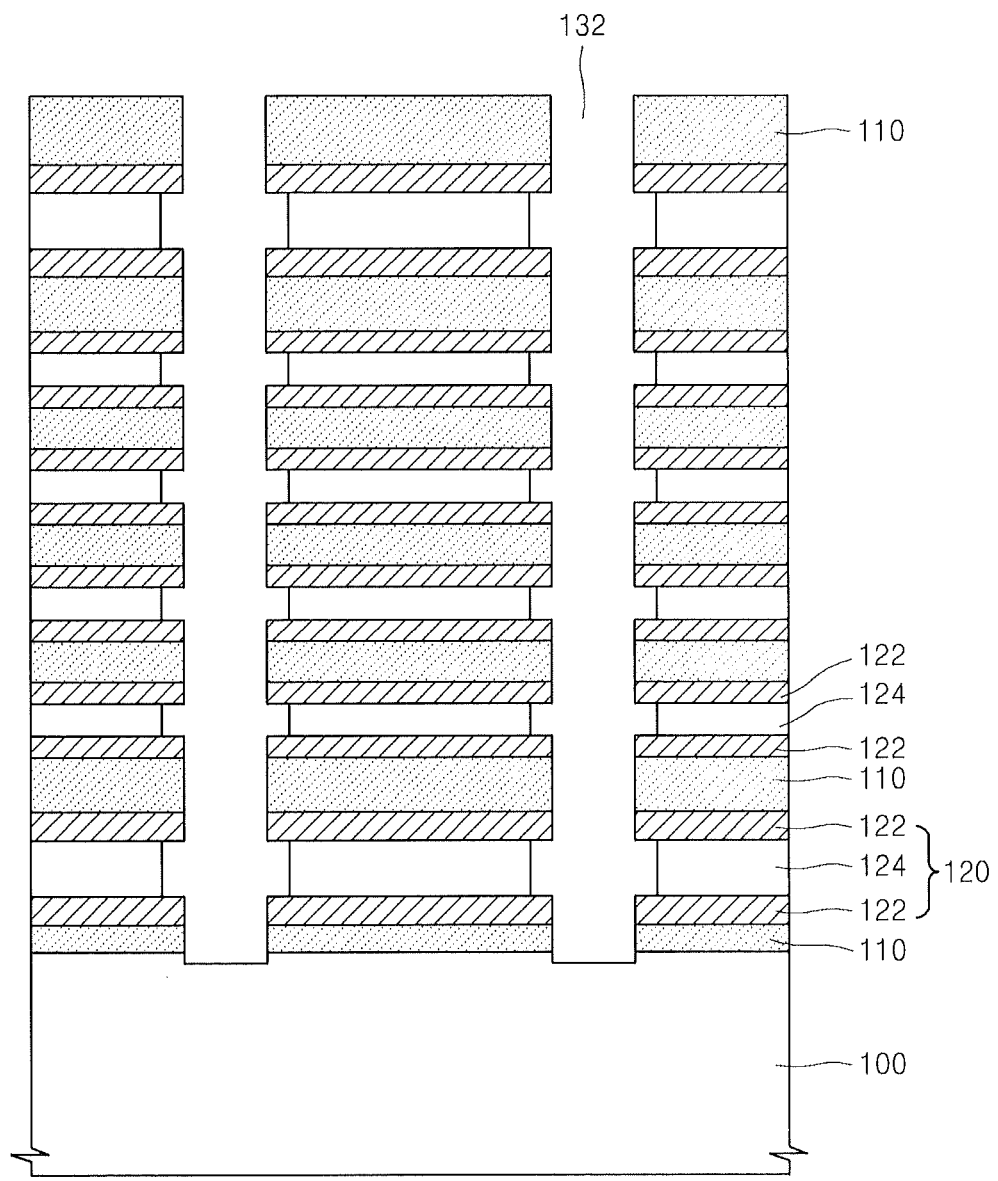

Referring to FIG. 5, the first sacrificial layers 124 exposed by the plurality of channel holes 132 are partially recessed beyond sidewalls of the channel hole 132. This process may be performed using an etchant that may selectively etch only the first sacrificial layers 124 with respect to the interlayer insulating layers 110 and the second sacrificial layers 122. The dimensions of the protrusions of the channel layers 140 (see FIG. 2) extending in the first direction (the x-axis direction of FIG. 2) are determined according to the extent to which the first sacrificial layers 124 are etched. As a result of the etching process, the channel holes 132 are formed having uneven (non-planar) shapes.

Figure 6:
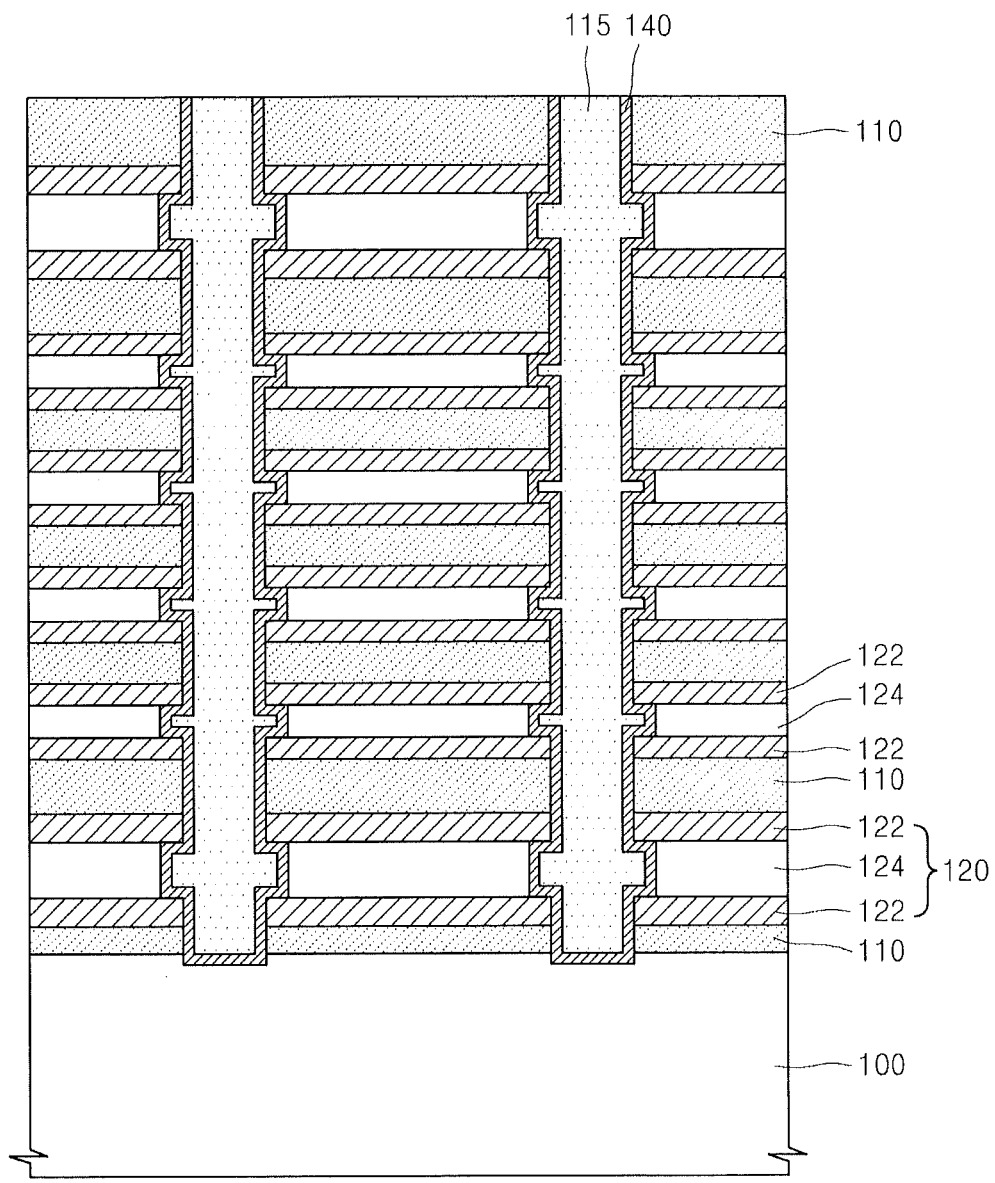

Referring to FIG. 6, a semiconductor material and an insulating material are sequentially deposited in the channel holes 132, followed by a planarization process in which the semiconductor material and the insulating material covering the uppermost interlayer insulating layer 110 are removed until the uppermost interlayer insulating layer 110 is exposed to provide channel layers 140 and channel hole insulating layer 115. For example, the planarization process may be performed using chemical mechanical polishing (CMP) or an etch-back process. For example, the channel layers 140 may be formed of silicon. The channel layers 140 may be formed as polycrystalline or monocrystalline Si epitaxial layers. The channel hole insulating layers 115 may include an oxide layer such as Undoped Silica Glass (USG), Spin On Glass (SOG) or Tonen SilaZene (TOSZ).

A conductive layer may be formed on the uppermost channel layer 140 to define metal contacts or plugs to be coupled to the bit lines. For example, the channel hole insulating layers 115 may be etched from their top regions to a predetermined thickness to form trenches, and the trenches may be filled with conductive layers.

Figure 7:
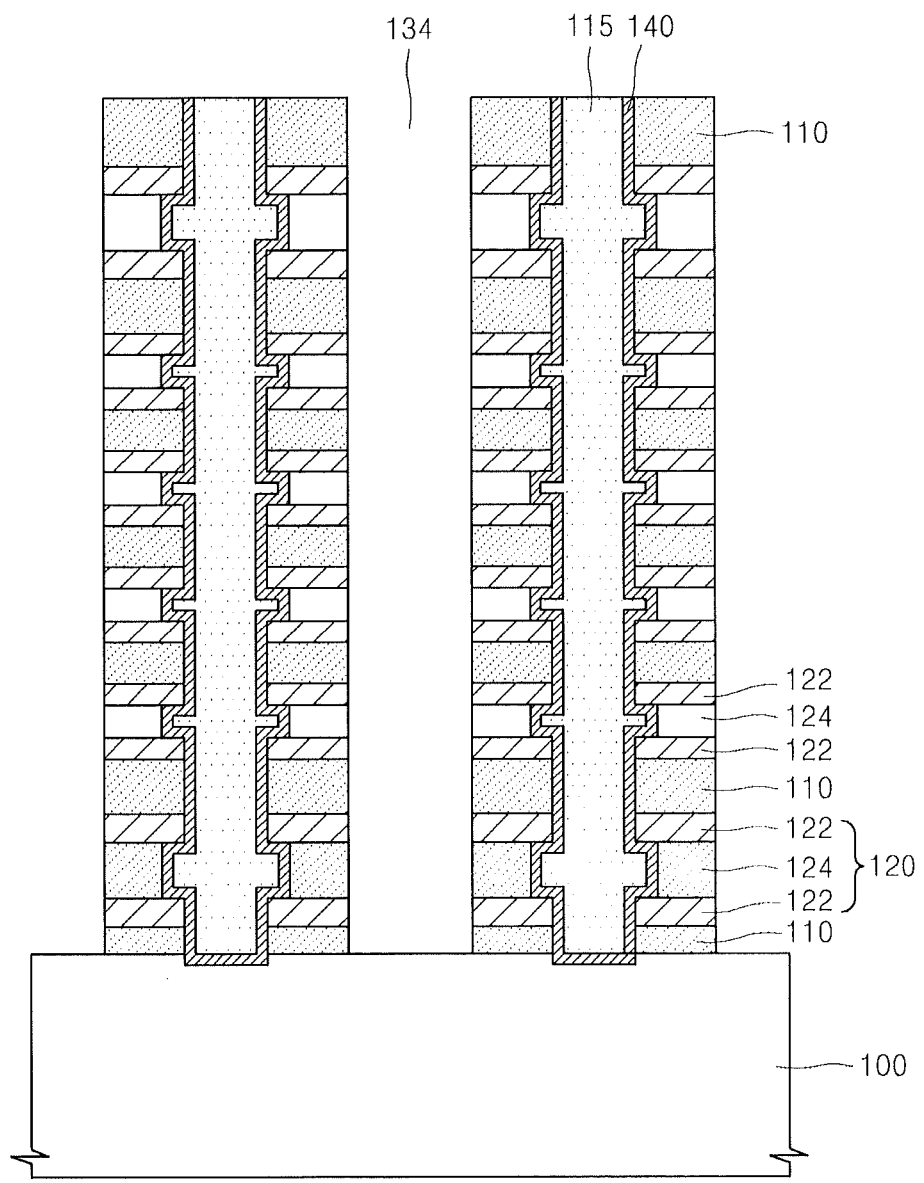

Referring to FIG. 7, the interlayer insulating layers 110 and the sacrificial layers 120 between each two adjacent channel layers 140 are etched to form a plurality of openings 134 exposing the upper surface of the substrate 100. Only one of the plurality of openings 134 is illustrated in FIG. 7. The plurality of openings 134 may be formed using photolithography.

Figure 8:
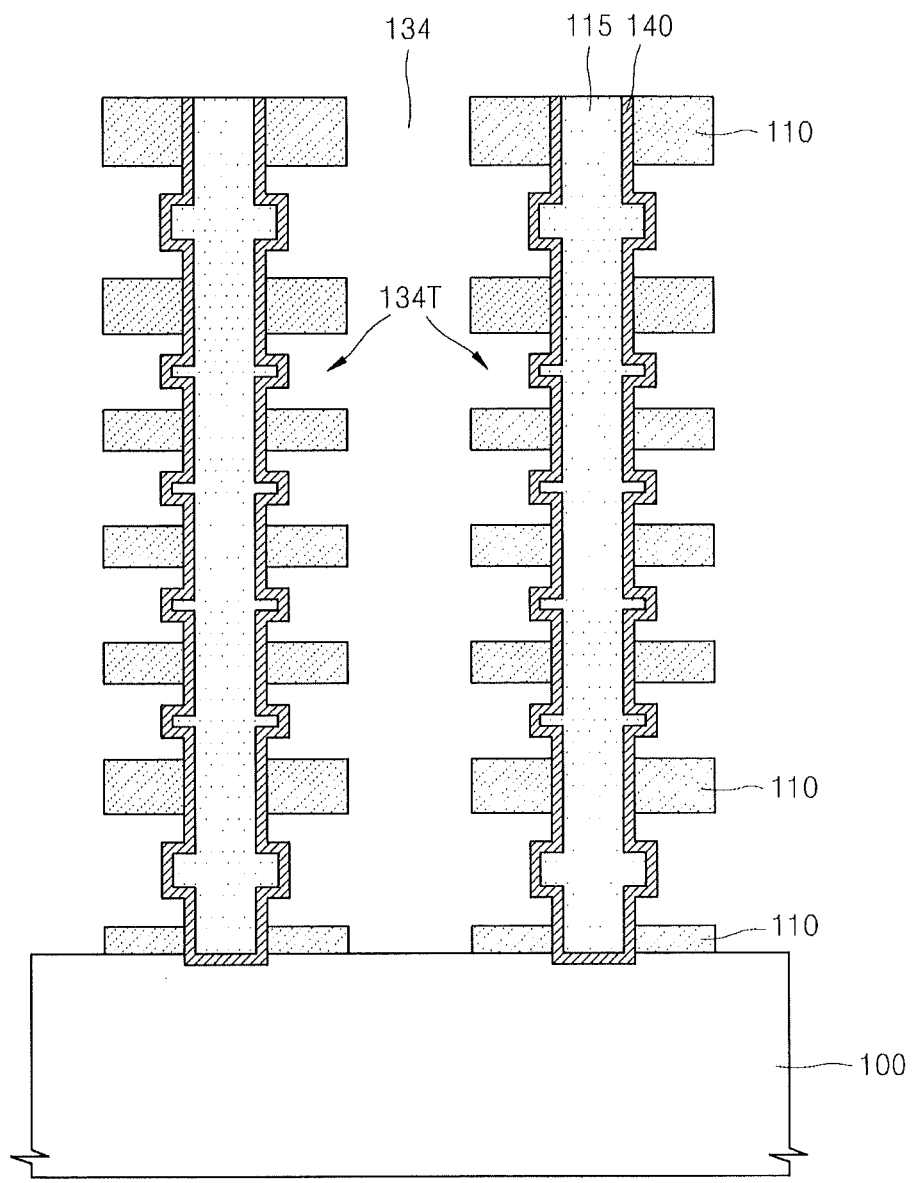

Referring to FIG. 8, the second sacrificial layers 122 and the first sacrificial layers 124 exposed by the plurality of openings 134 are removed.

For example, the second and first sacrificial layers 122 and 124 may be removed using isotropic etching. An etchant may be permeated between the plurality of interlayer insulating layers 110 through the openings 134. The isotropic etching process may be wet etching or chemical dry etching (CDE). The second sacrificial layers 122 and the first sacrificial layers 124 may be simultaneously etched using the same kind of etchant. Alternatively, the second sacrificial layers 122 and the first sacrificial layers 124 may be separately etched one after another using different etchants.

As a result of removing the plurality of first sacrificial layers 124 and the plurality of second sacrificial layers 122 from between the plurality of interlayer insulating layers 110, a plurality of tunnels 134T in the openings 134 are formed between the plurality of interlayer insulating layers 110. The plurality of tunnels 134T expose the sidewalls of the channel layers 140.

Figure 9:
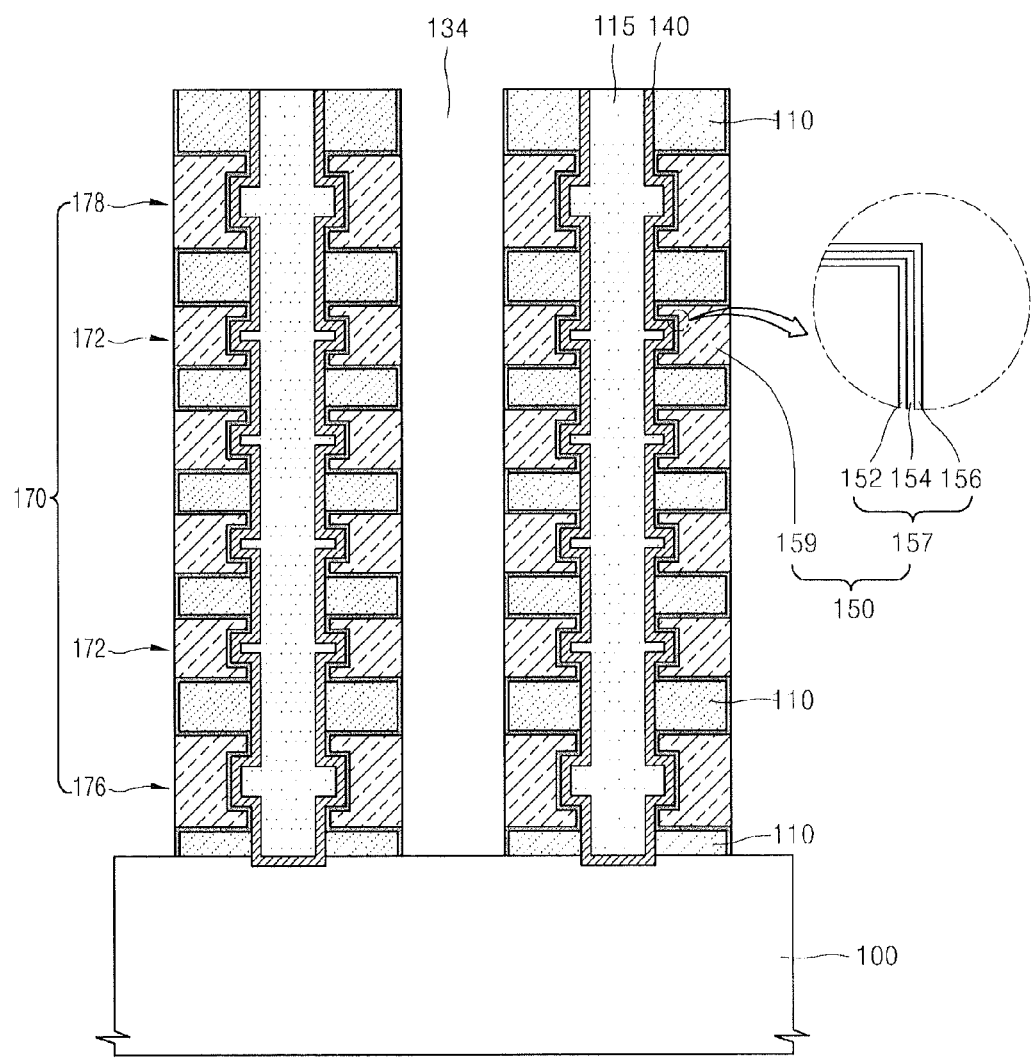

Referring to FIG. 9, the gate insulating layer 157 is formed to cover the surfaces of the plurality of interlayer insulating layers 110 and the channel layers 140 exposed by the plurality of openings 134. The gate insulating layer 157 may have a stacked structure in which a tunneling insulating layer 152, a charge storage layer 154 and a blocking insulating layer 156 are sequentially stacked on a sidewall of the channel layers 140 in the order stated. Then, a conductive material is deposited into the openings 134 so as to completely fill the plurality of tunnels 134T, which are interconnected with the openings 134, on the sidewalls of the channel layers 140, followed by removing the unnecessary conductive material from the openings 134 until the conductive material remains only within the plurality of tunnels 134T, thus resulting in the gate electrodes 159.

The gate insulating layer 157 and the gate electrodes 159 may be formed using chemical vapor deposition (CVD) or electroplating. For example, the gate electrodes 159 may be formed of tungsten.

The gates 150 of the plurality of transistors 170 may be respectively coupled to the string selection lines SSL, the ground selection lines GSL and the word lines WL0-WLn via contact plugs in the periphery of cell memory regions. Since the selection transistors 176 and 178 includes only one selection transistor, i.e., respectively, a single ground selection transistor GST and a single string selection transistor SST, instead of a pair of transistors, it is sufficient to connect only one contact plug to each of the string selection line SSL and the ground selection line GSL. Thus, the overall process may be simplified compared to when a pair of transistors should be connected to each of the selection lines.

Figure 10:
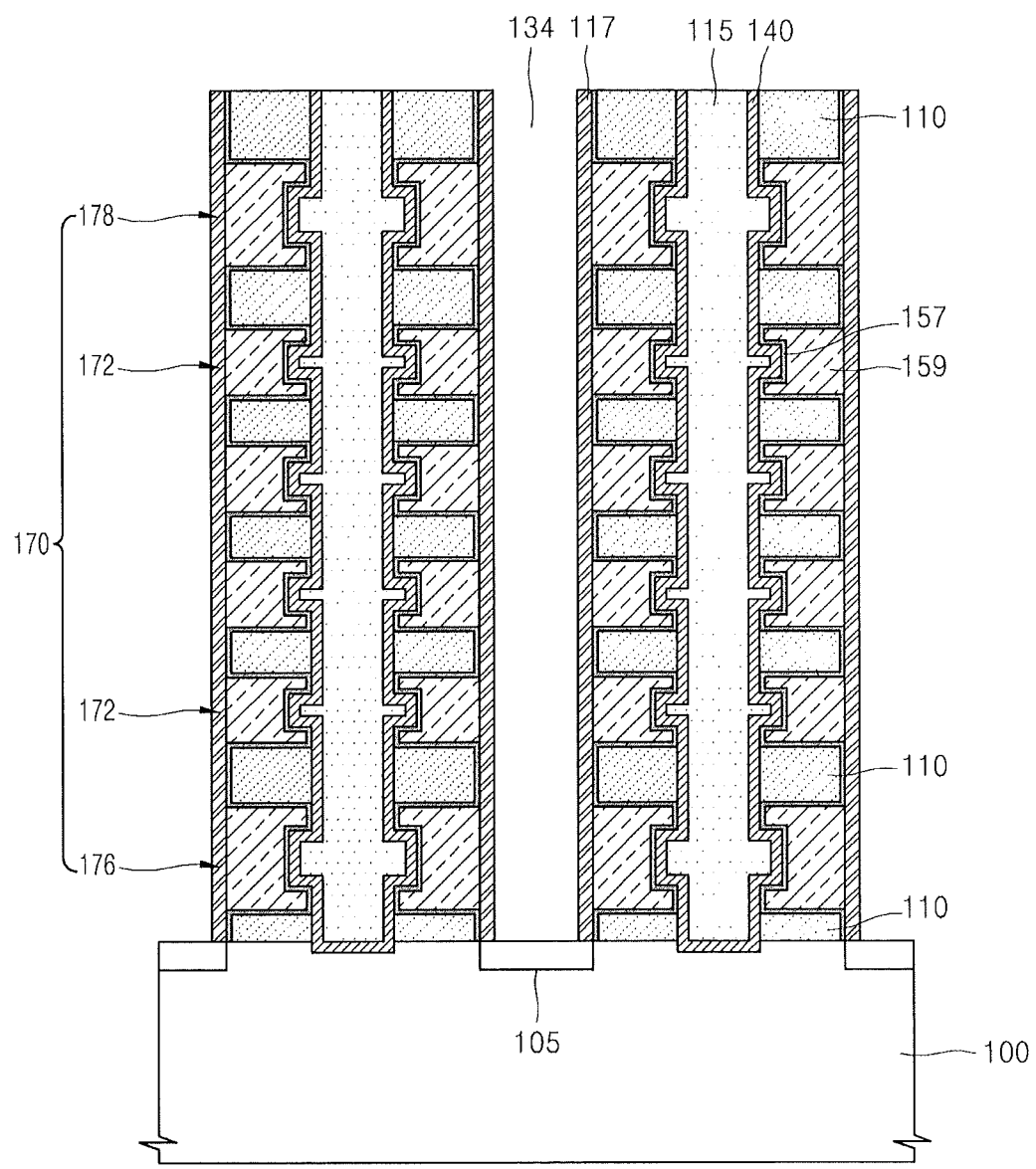

Referring to FIG. 10, the upper surface of the substrate 100 exposed by the plurality of openings 134 may be doped with impurities to form impurity regions 105. The impurity regions 105 may be heavily-doped impurity regions formed by injecting $N^+$-type impurity ions. The process of forming the impurity regions 105 in the upper surface of the substrate 100 exposed by the openings 134 may be performed in any preceding or subsequent processes. The impurity regions 105 may function as common source regions. The spacers 117 may be formed on the sidewalls of the openings 134 defined in the substrate 100. The spacers 117 may be formed to cover the parts of the gate insulating layers 157 and the gate electrodes 159 exposed by the openings 134. The spacers 117 may be formed by depositing an insulating layer on the surfaces of the channel hole insulating layers 115 so as to fill the openings 134, and etching the insulating layer using, for example, an etch-back process. The insulating layer for forming the spacers 117 may include a silicon nitride layer.

Then, a conductive material is deposited between the spacers 117 in the openings 134 to form conductive lines. The conductive lines may constitute the common source lines (CSL) 180 of FIG. 2 connected to the impurity regions 150, and may be coupled to sources of the ground selection transistors 176. The nonvolatile memory device 1 of FIG. 2 may be fabricated through the processes described above.

Figure 11:
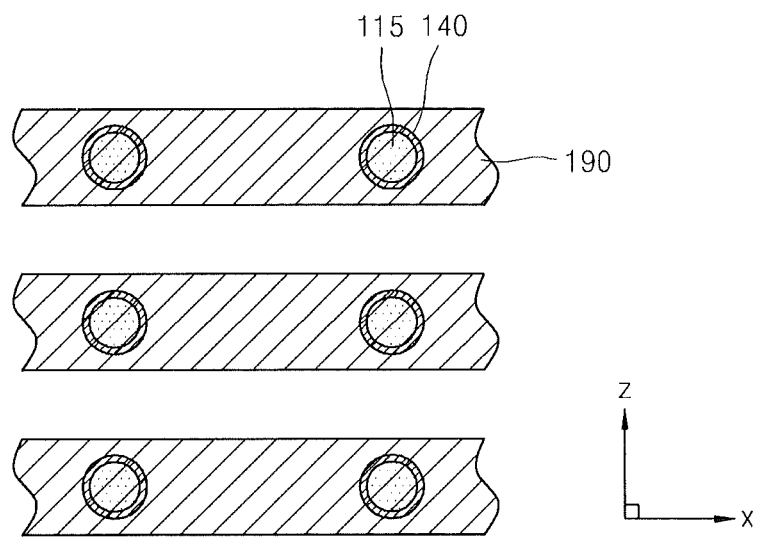
FIGS. 11 and 12 are plan views illustrating the relative positions of channel layers with respect to bit lines in the vertical structure nonvolatile memory device in some embodiments according to the inventive concept.
Figure 12:
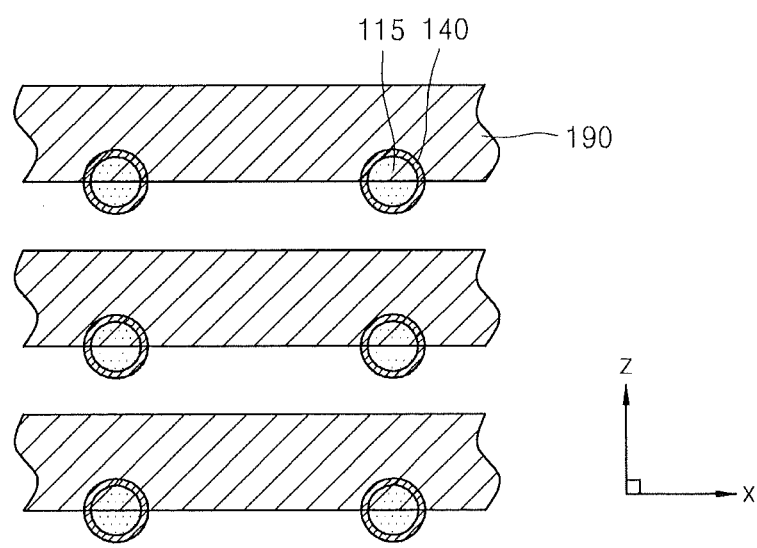

FIGS. 11 and 12 are plan views illustrating the relative positions of the channel layers 140 with respect to the bit lines 190, according to exemplary embodiments, in the vertical structure nonvolatile memory device.

In some embodiments according to the inventive concept, the channel layers 140 may be in the form of annular pillars filled with the channel hole insulating layers 115, as illustrated in FIG. 11. The bit lines 190 may be disposed to completely cover upper ends of the channels layers 140, as illustrated in FIG. 1. Alternatively, the bit lines 190 may be disposed to partially cover the upper ends of the channel layers 140, as illustrated in FIG. 12. Furthermore, as described above with reference to FIG. 6, the channel layers 140 may be coupled to the bit lines 190 via metal contacts or plugs formed from the conductive layers deposited on the channel layers 140.

Figure 13:
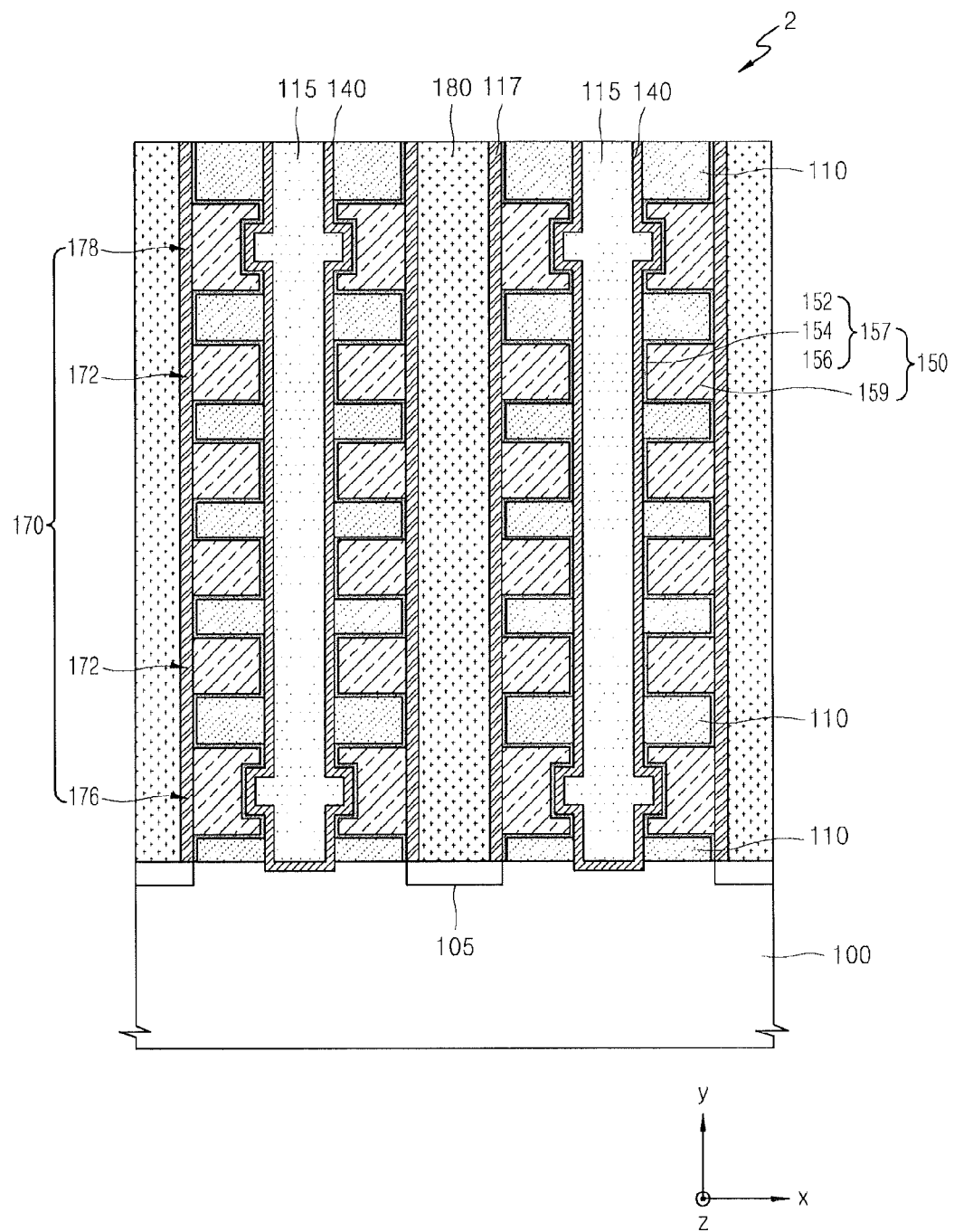
FIG. 13 is a cross-sectional view of a vertical structure nonvolatile memory device in some embodiments according to the inventive concept.

FIG. 13 is a cross-sectional view of a vertical structure nonvolatile memory device 2 according to another embodiment of the present inventive concept.

Referring to FIG. 13, the channel layers 140 have protrusions only in regions adjacent to the gates 150 of the string selection transistor 178 and the ground selection transistor 176. This configuration may be implemented if, for example, in the fabrication processes described with reference to FIGS. 3 to 10, the first sacrificial layer 124 is deposited only between the uppermost pair and between the lowermost pair of second sacrificial layers 122 in which the selection transistors 176 and 178 are to be defined, during the process described above with reference to FIG. 3. In the nonvolatile memory device 2, the selection transistors 176 and 178 have extended channel lengths. Thus, a larger amount of current may flow in the memory cell strings.

Figure 14:
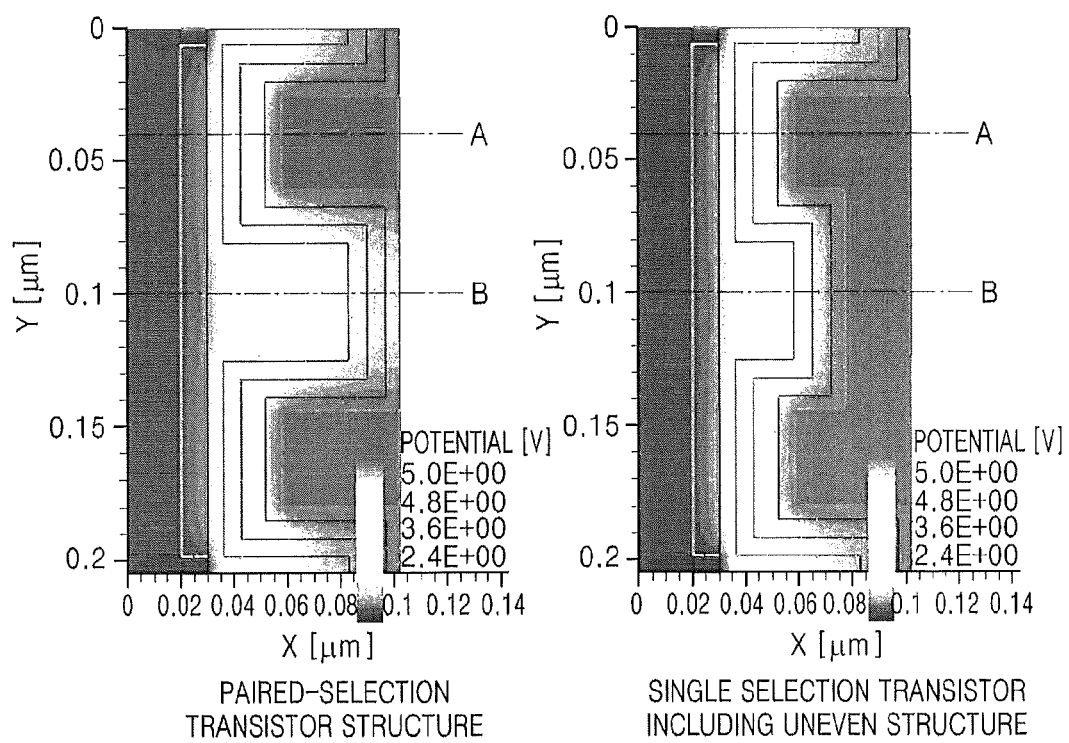
FIGS. 14 through 16 are graphs illustrating the results of simulation of potential distribution in the vertical structure nonvolatile memory device of FIG. 13.
Figure 15:
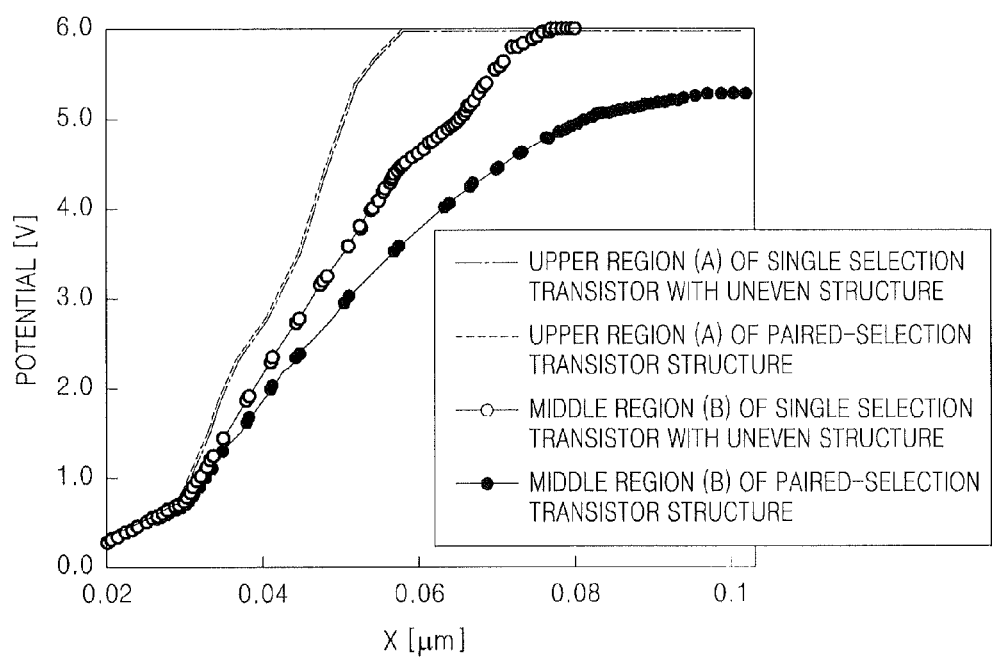
Figure 16:
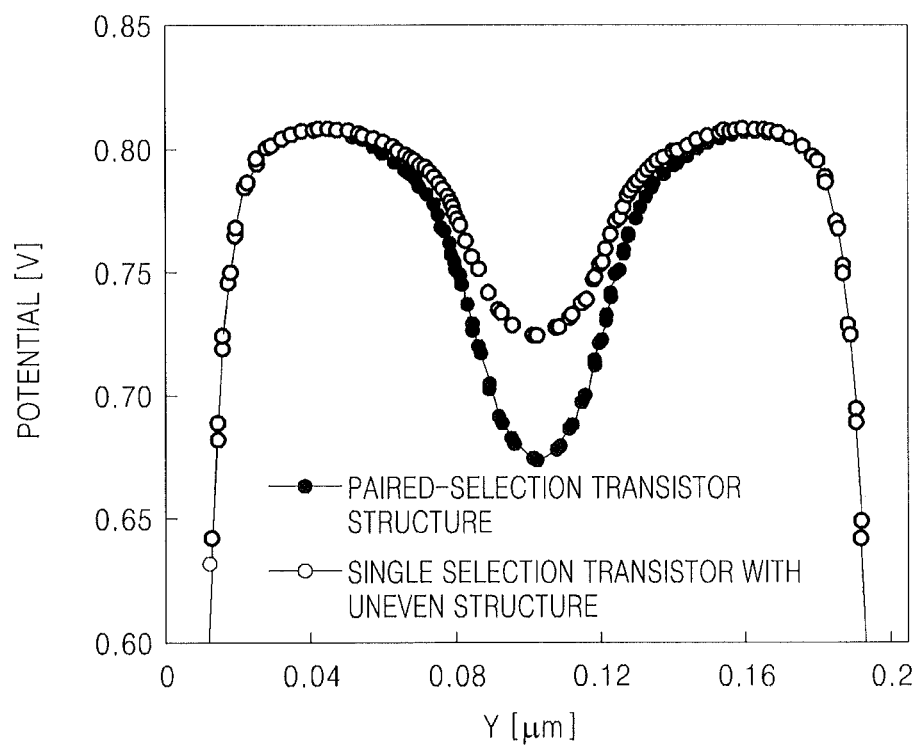

FIGS. 14 through 16 are graphs illustrating the results of simulation of potential distribution in the vertical structure nonvolatile memory device 2 of FIG. 13.

FIG. 14 illustrates the distributions of potential in the gate of a selection transistor having the uneven structure illustrated in FIG. 13 in the first and second directions (x-axis and y-axis directions of FIG. 14), as opposed to the distributions of potential in the two gates of a paired-selection transistor structure consisting of a pair of transistors. The paired-selection transistor structure refers to a selection transistor configuration consisting of a pair of separate transistors that are serially disposed. FIG. 14 illustrates the distributions of potential when a voltage of 6V was applied to the selection translator structures whose channel layers include an insulating layer, a channel layer, and a gate insulating layer, shown from left to right in FIG. 14, which are stacked upon one another. For the selection transistor having the uneven structure of FIG. 13, a higher level of potential was distributed in the middle region (B) of the uneven structure in the second direction (the y-axis direction of FIG. 14), compared to the paired-selection transistor structure. In particular, in the region of the uneven structure in the coordinates of about 0.08 um or more in the first direction (the x-axis direction of FIG. 14), the potential was maintained as high as 6.0V or greater.

FIG. 15 is a graph illustrating the distributions of potential in an upper region (A) and middle region (B) of each of the selection transistor structures in the first direction (the x-axis direction of FIG. 14). Referring to FIG. 15, in the upper regions (A), there was substantially no potential difference between the selection transistor having the uneven structure and the paired-selection transistor structure. However, in the middle region (B) of the selection transistor having the uneven structure, the potential level was higher than the paired-selection transistor structure.

FIG. 16 is a graph illustrating the distributions of potential in the selection transistor structures in the second direction (the y-axis direction of FIG. 14). Referring to FIG. 16 the selection transistor having the uneven structure had a higher potential distribution in the middle region (B) than the paired-selection transistor structure. Therefore, the vertical structure nonvolatile memory device, according to embodiments of the inventive concept, having the uneven structure between the gate of the selection transistor and the channel may improve the control ability of the gate. In addition, the switching performance of the selection transistor may be improved.

Figure 17:
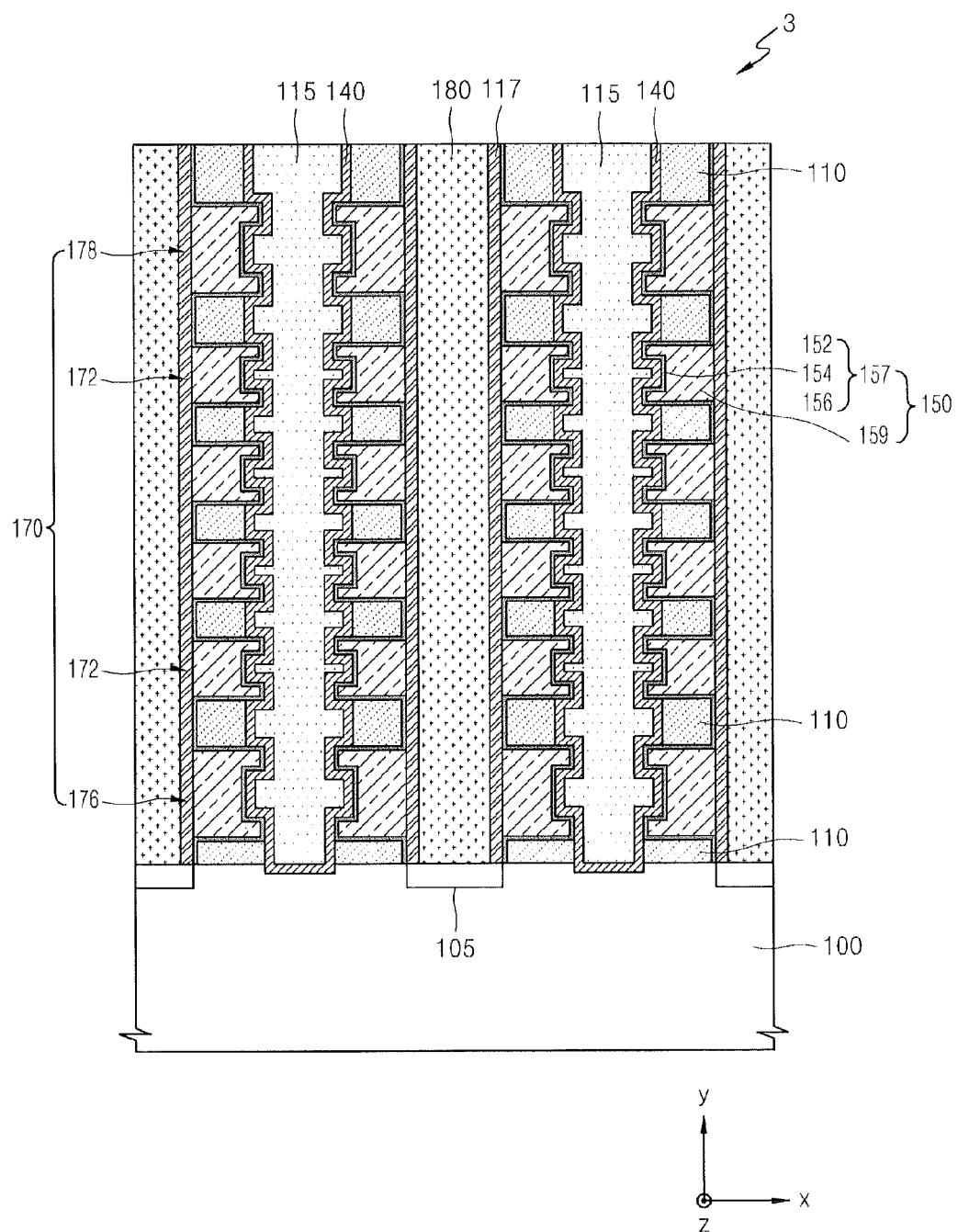
FIG. 17 is a cross-sectional view of a vertical structure nonvolatile memory device in some embodiments according to the inventive concept.

FIG. 17 is a cross-sectional view of a vertical structure nonvolatile memory device 3 according to another embodiment.

Referring to FIG. 17, in the nonvolatile memory device 3, the sides of the interlayer insulating layers 110 adjacent to the channel layers 140 are recessed in the first direction (an x-axis direction of FIG. 7) with respect to the gates 150 of the transistors 170 so as to expose surface edge portions of the gates 150. The exposed surface edge portions of the gates 150 are covered by the channel layers 140. This configuration may be implemented if, for example, in the fabrication processes described with reference to FIGS. 3 to 10, the first sacrificial layers 124 and the interlayer insulating layers 110 are formed of the same material or materials having substantially the same etch selectivity in an etchant with respect to the second sacrificial layers 122, and the interlayer insulating layers 110 are partially removed together with the first sacrificial layers 124 in the etching process described with reference to FIG. 5. In the nonvolatile memory device 3 according to the current embodiment, the transistors 170 may have further extended channel lengths.

Figure 18:
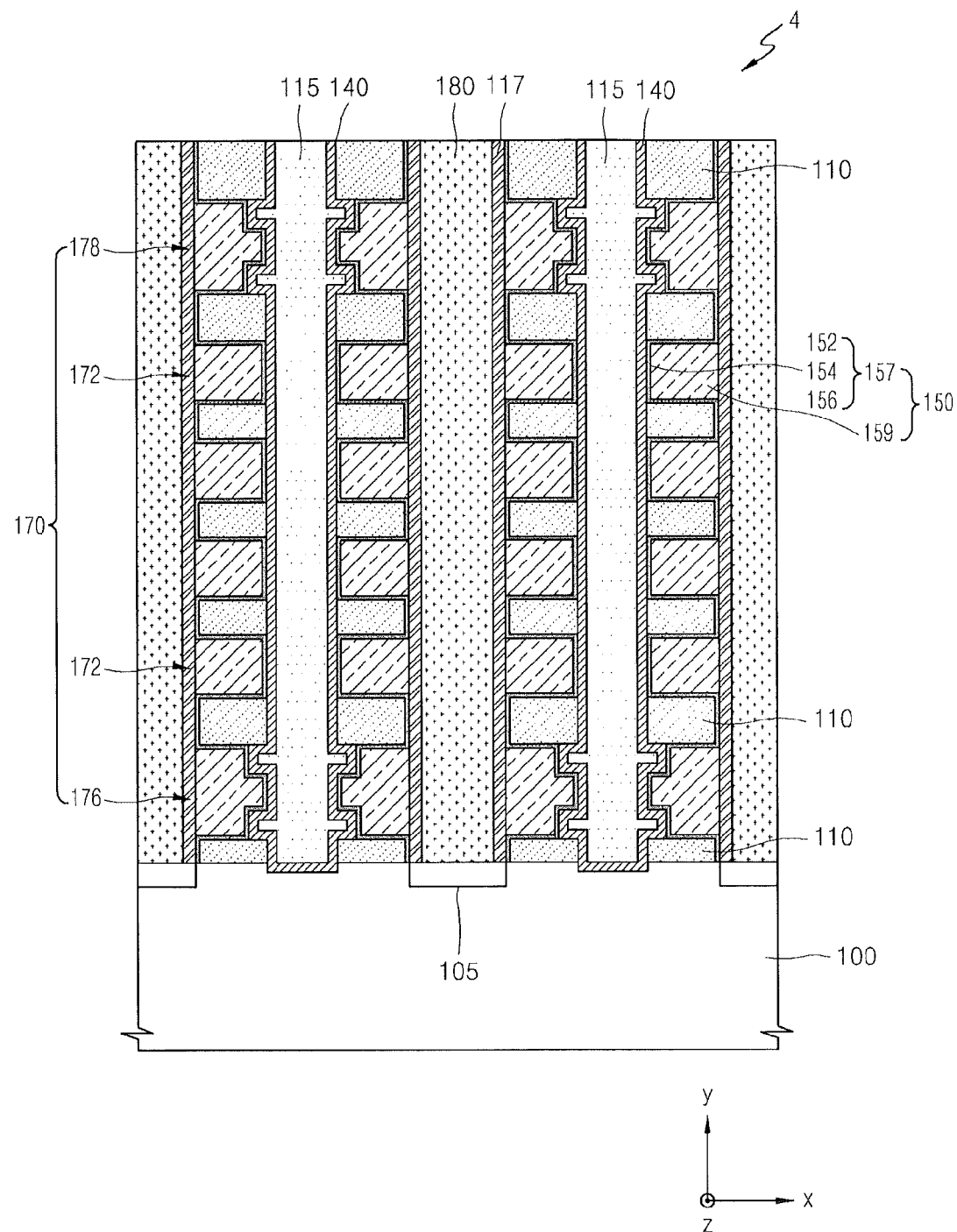
FIG. 18 is a cross-sectional view of a vertical structure nonvolatile memory device in some embodiments according to the inventive concept.

FIG. 18 is a cross-sectional view of a vertical structure nonvolatile memory device 4 according to another embodiment.

Referring to FIG. 18, in the nonvolatile memory device 4, portions of the channel layers 140 associated with the selection transistors 176 and 178, have uneven structures in regions adjacent to the gates 150, which include the gate insulating layers 157 and the gate electrodes 159. Each uneven structure includes two protrusions in upper and lower regions of the channel layer 140. This configuration may be implemented if, for example, in the fabrication processes described with reference to FIGS. 3 to 10, the second sacrificial layers 122 on the upper and lower surfaces of the first sacrificial layers 124 are partially removed, instead of the first sacrificial layers 124, during the process described with reference to FIG. 5. Though only the selection transistors 176 and 178 have the uneven structures in FIG. 18, the inventive concept is not limited thereto. For example, the second transistors 172 may also have such uneven structures, with multiple protrusions per gate.

Figure 19:
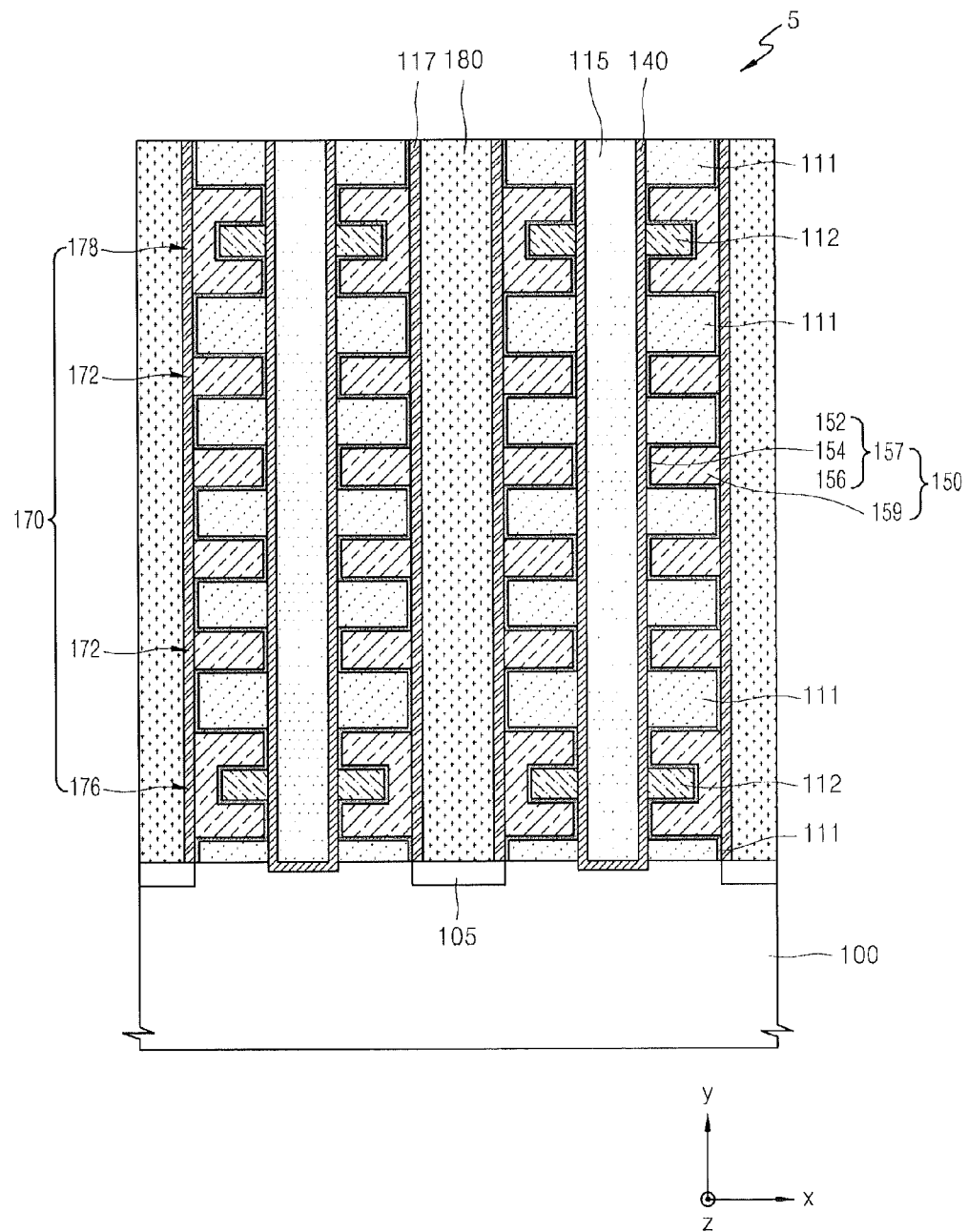
FIG. 19 is a cross-sectional view of a vertical structure nonvolatile memory device in some embodiments according to the inventive concept.

FIG. 19 is a cross-sectional view of a vertical structure nonvolatile memory device 5 according to another embodiment.

Referring to FIG. 19, in the nonvolatile memory device 5, the gates 150 of the selection transistors 176 and 178, which include the gate insulating layers 157 and the gate electrodes 159, have uneven structures each including a recess in the middle of the gate 150 that deepens in the first direction (an x-axis direction of FIG. 9). Spaces between the recesses of the gates 150 and the channel layers 140 are filled with second interlayer insulating layers 112. The second interlayer insulating layers 112 may contain a material having a different etch selectivity from the first interlayer insulating layers 110 disposed between the plurality of first transistors 172 and between one of the first transistors 172 and the selection transistors 176 and 178. The recesses may be located in the middles of the gates 150 of the transistors 170 in the second direction (a y-axis direction of FIG. 19, and may also extend in a third direction (a z-axis direction of FIG. 9). The recesses may have a dimension in the first direction (the x-axis direction of FIG. 9) that is smaller than the dimension of the transistors 170. Though only the selection transistors 176 and 178 have the uneven structures in FIG. 19, the inventive concept is not limited thereto. For example, the second transistors 172 may also have such uneven structures including insulating layers between the gates 150 and the channel layers 140.

In the vertical structure nonvolatile memory device 5 according to the current embodiment, each of the selection transistors 176 and 178 is configured to include at least two parts interconnected so as to be filled with an electrode material without a void, unlike in a single transistor without recesses, to form the gate electrode 159 between the first interlayer insulating layers 111. In addition, since the gate electrodes 159 are connected within memory cell strings, wiring processes may be simplified, compared to the configuration in which each selection transistor includes a pair of serially disposed transistors.

FIGS. 20 through 23 are cross-sectional views for describing a method of fabricating the vertical structure nonvolatile memory device 5 of FIG. 19, according to an exemplary embodiment.

Figure 20:
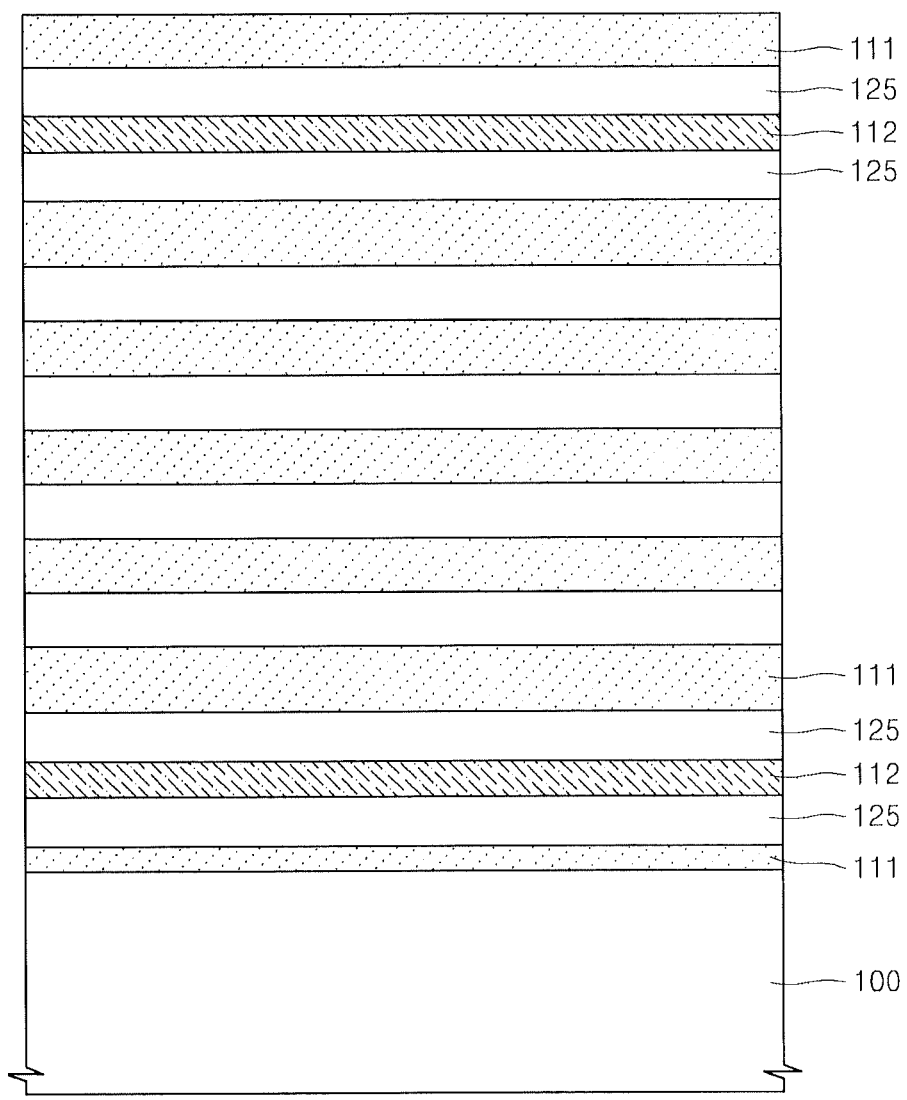
FIGS. 20 through 23 are cross-sectional views for describing a method of fabricating the vertical structure nonvolatile memory device of FIG. 19.

Referring to FIG. 20, the plurality of first and second interlayer insulating layers 111 and 112, and the plurality of sacrificial layers 125 are alternately stacked on the substrate 100 in substantially the same manner as described above with reference to FIG. 3, except that the second interlayer insulating layers 112 are stacked as the second end insulating layers from the upper and lower surfaces of the stack structure on the substrate 100, while the first interlayer insulating layers 111 constitute the other insulating layers. The first interlayer insulating layers 111 and the second interlayer insulating layers 112 may contain materials having different etch selectivity.

Figure 21:
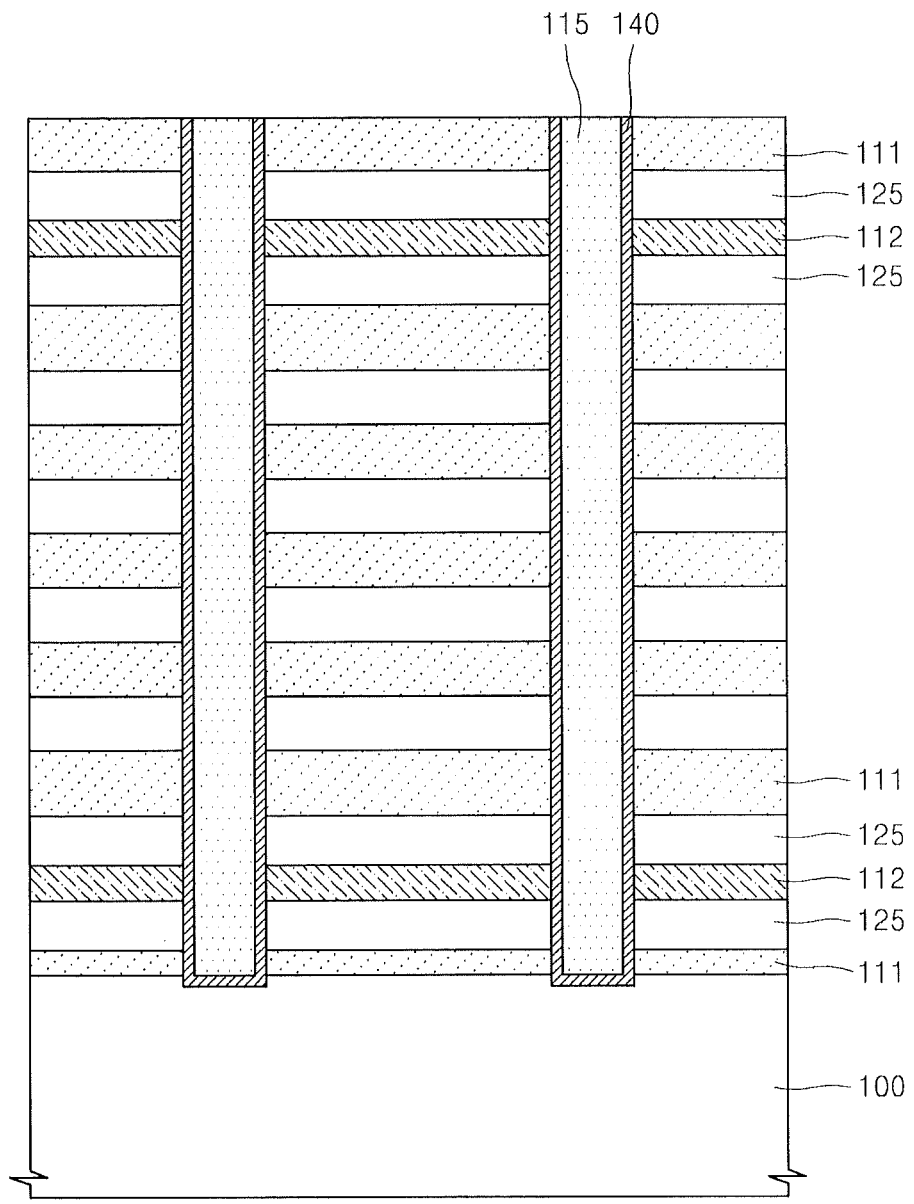

Referring to FIG. 21, the plurality of first interlayer insulating layers 111, the plurality of second interlayer insulating layers 112, and the plurality of sacrificial layers 125 are etched in the same manner as described with reference to FIG. 4, to form the plurality of channel holes 132 (see FIG. 4). Then, a semiconductor material and an insulating material are sequentially deposited in the channel holes 132, followed by chemical mechanical polishing (CMP) or performing an etchback process to form the channel layers 140 and the channel hole insulating layers 115 in the channel holes 132. For example, the channel layers 140 may be formed as polycrystalline or monocrystalline Si epitaxial layers.

Figure 22:
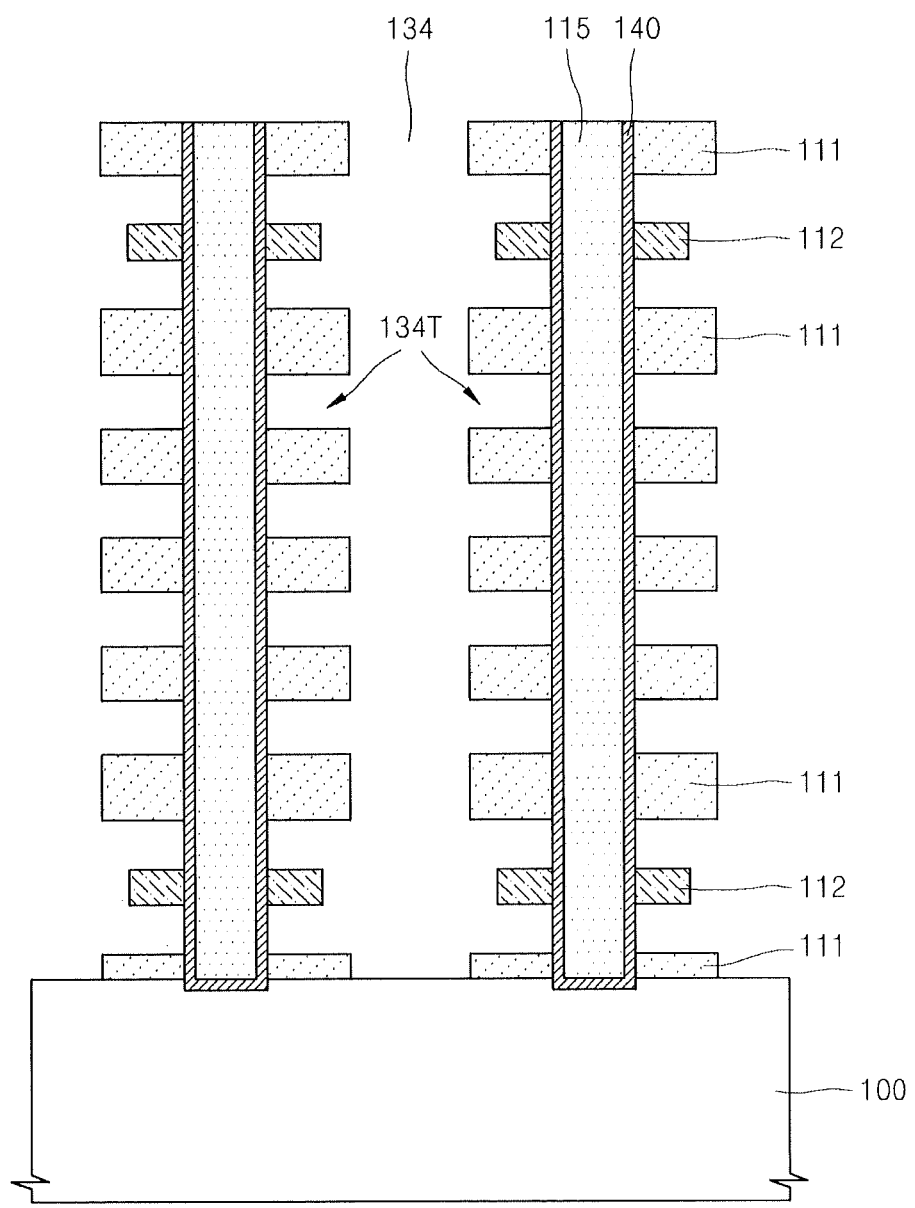

Referring to FIG. 22, the plurality of first interlayer insulating layers 111, the plurality of second interlayer insulating layers 112 and the plurality of sacrificial layers 125 between each two adjacent channel layers 140 are etched to form a plurality of openings 134 exposing the upper surface of the substrate 100. Then, the plurality of sacrificial layers 125 exposed by the plurality of openings 134 are removed, and the second interlayer insulating layers 112 are partially removed. The sacrificial layers 125 and the second interlayer insulating layers 112 may be simultaneously etched using the same kind of etchant. Alternatively, the sacrificial layers 125 and the second interlayer insulating layers 112 may be separately etched one after another using different kinds of etchants.

As a result, a plurality of tunnels 134T interconnected with the openings 134 are formed between adjacent first interlayer insulating layers 111. Sidewalls of the channel layers 140 are exposed by the tunnels 134T. The second interlayer insulating layers 112 may be partially etched to have dimensions in the first direction (the x-axis direction of FIG. 19) that are smaller than the dimensions of the first interlayer insulating layers 111.

Figure 23:
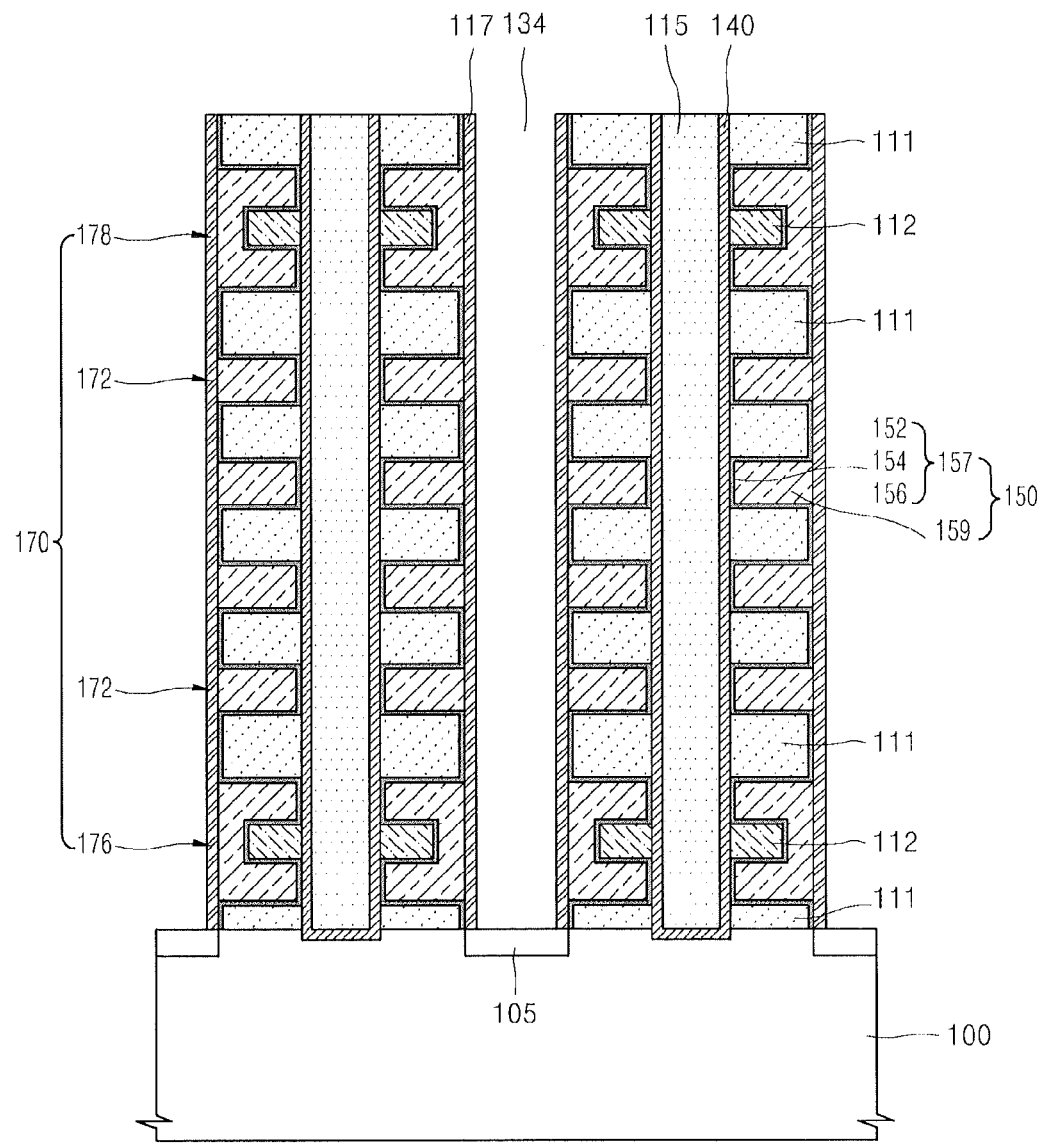

Referring to FIG. 23, after the processes described above with reference to FIG. 9 are performed, the upper surface of the substrate 100 exposed by the openings 134 is doped with impurities in a similar manner as described above with reference to FIG. 10, to form impurity regions 105. Then, an insulating layer is deposited to form spacers 117 on the sidewalls of the openings 134 defined in the substrate 100. The insulating layer for forming the spacers 117 may include a silicon nitride layer.

Then, a conductive material is deposited between the spacers 117 in the openings 134 to form conductive lines 180 (see FIG. 19). The conductive lines 180 may constitute the common source lines (CSL) 180 of FIG. 19, and may be coupled to sources of the ground selection transistors 172. The nonvolatile memory device 5 of FIG. 19 may be fabricated through the processes described above.

In the nonvolatile memory device according to embodiments of the present inventive concept, channel layers may have a macaroni-like cylindrical structure surrounding an insulating pillar. However, the inventive concept is not limited to the structure of the channel layers. For example, channel layers may be in the form of lines. For example, linear channel layers may be formed on the sidewalls of insulating pillars.

Figure 24:
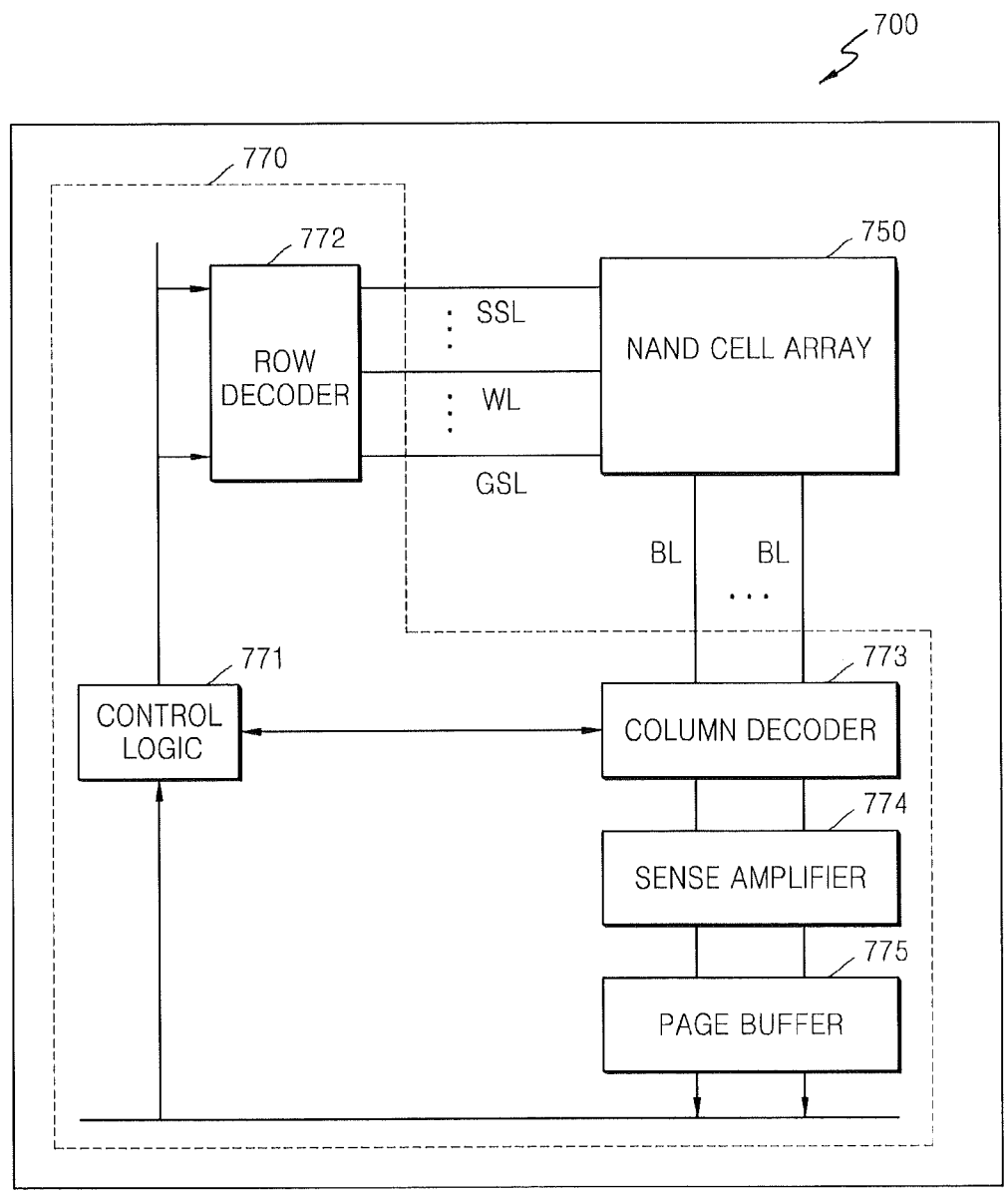
FIG. 24 is a block diagram of a nonvolatile memory device in some embodiments according to the inventive concept.

FIG. 24 is a block diagram illustrating a nonvolatile memory device 700 according to an exemplary embodiment.

Referring to FIG. 24, in the nonvolatile memory device 700, a NAND cell array 750 may be coupled to a core circuit unit 770. For example, the NAND cell array 750 may include at least one of the nonvolatile memory devices 1-5 respectively described above with reference to FIGS. 2, 13, 17, 18 and 19. The core circuit unit 770 may include a control logic 771, a row decoder 772, a column decoder 773, a sense amplifier 774, and a page buffer 775.

The control logic 771 may communicate with the row decoder 772, the column decoder 773, and the page buffer 775. The row decoder 772 may communicate with the NAND cell array 750 via a plurality of string selection lines SSL, a plurality of word lines WL, and a plurality of ground selection lines GSL. The column decoder 773 may communicate with the NAND cell array 750 via a plurality of bit lines BL. The sense amplifier 774 may be connected to the column decoder 733 to receive an output from the column decoder 773 when a signal is output from the NAND cell array 750.

For example, the control logic 771 may transmit a row address signal to the row decoder 772, and the row decoder 772 may decode the row address signal and transmit the same to the NAND cell array 750 via the string selection lines SSL, the word lines WL, and the ground selection lines GSL. The control logic 771 may transmit a column address signal to the column decoder 773 or the page buffer 775, and the column decoder 773 may decode the column address signal and transmit the same to the NAND cell array 750 via the bit lines BL. Signals from the NAND cell array 750 may be transmitted to the sense amplifier 773 via the column decoder 774, and be amplified in the sense amplifier 773 and transmitted through the page buffer 775 to the control logic 771.

Figure 25:
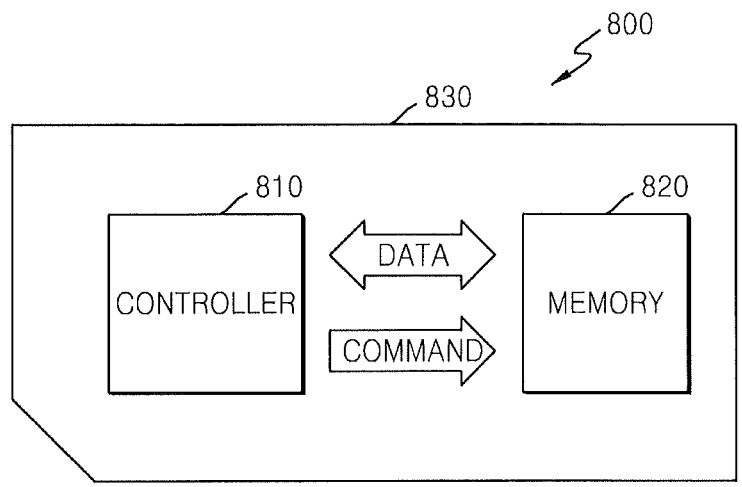
FIG. 25 is a schematic view illustrating a memory card according in some embodiments according to the inventive concept.

FIG. 25 is a schematic view illustrating a memory card 800 according to an exemplary embodiment.

Referring to FIG. 25, the memory card 800 may include a controller 810 and a memory unit 820, which are installed in a housing 830. The controller 810 and the memory unit 820 may exchange electrical signals. For example, the memory unit 820 and the controller 810 may exchange data according to a command from the controller 810. The memory card 800 may store data in the memory unit 820 or may externally output data from the memory unit 820.

For example, the memory unit 820 may include at least one of the nonvolatile memory devices 1-5 respectively described above with reference to FIGS. 2, 13, 17, 18 and 19. The memory card 800 may be used as a data storage medium of various types of portable appliances. For example, the memory card 800 may include a multimedia card (MMC) or a secure digital (SD) card.

Figure 26:
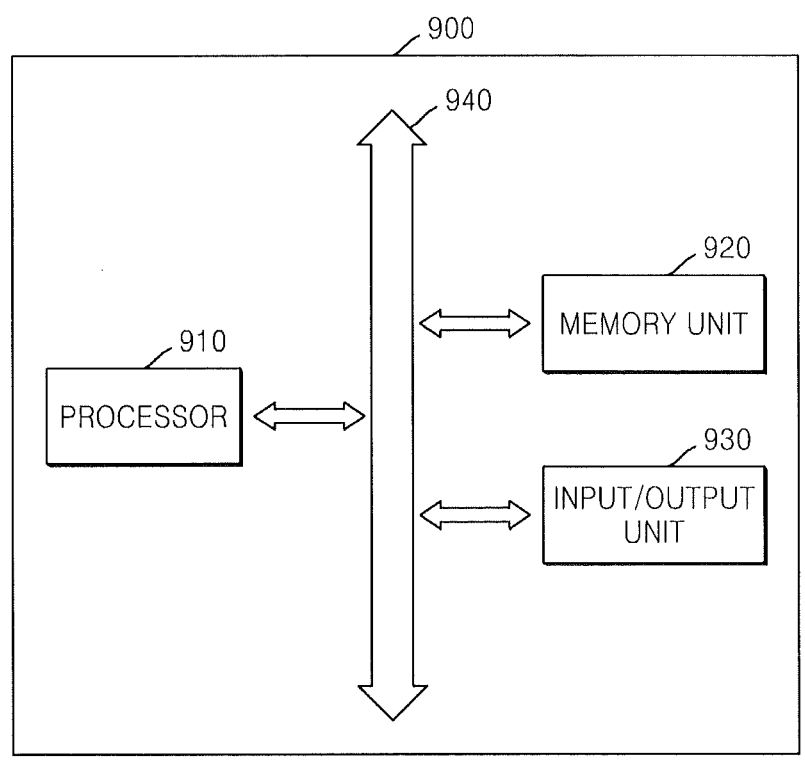
FIG. 26 is a block diagram of an electronic system in some embodiments according to the inventive concept.

FIG. 26 is a block diagram illustrating an electronic system 900 according to an exemplary embodiment.

Referring to FIG. 26, the electronic system 900 may include a processor 910, an input/output unit 930, and a memory unit 920. Data communication between the processor 910, the input/output unit 930 and the memory unit 920 may be conducted via a bus 940. The processor 910 may execute programs and control the electronic system 900. The input/output unit 930 may be used to input data to or output data from the electronic system 900. The electronic system 900 may be connected to an external device, for example, a personal computer or a network, via the input/output unit 930 to exchange data with the external device. The memory unit 920 may store codes and data for operating the processor 910. For example, the memory unit 920 may include at least one of the nonvolatile memory devices 1-5 respectively described above with reference to FIGS. 2, 13, 17, 18 and 19.

The electronic system 900 may constitute various types of electronic controllers including the memory unit 920. For example, the electronic system 900 may be used in a mobile phone, an MP3 player, a navigation device, a solid state disk (SSD), or other household appliances.

While the inventive concept has been particularly shown and described with reference to exemplary embodiments thereof, it will be understood that various changes in form and details may be made therein without departing from the spirit and scope of the following claims.

What is claimed is:

1. A vertical structure nonvolatile memory device comprising:
   a channel layer extending in a vertical direction on a substrate; and
   a memory cell string comprising a plurality of transistors disposed on the substrate in the vertical direction along a vertical sidewall of the channel layer, wherein at least one of the plurality of transistors includes at least one recess in a gate of the transistor into which at least one protrusion, comprising the channel layer, extends.

2. The vertical structure nonvolatile memory device of claim 1, wherein the plurality of transistors of the memory cell string comprise a plurality of memory cell transistors, and at least one selection transistor disposed at one end or at both ends of the memory cell string.

3. The vertical structure nonvolatile memory device of claim 2, wherein the at least one recess and at least one protrusion are included in the at least one selection transistor.

4. The vertical structure nonvolatile memory device of claim 1, wherein an entire width of the channel layer protrudes into the recess and is conformally on a surface of the recess.

5. The vertical structure nonvolatile memory device of claim 1, wherein the at least one protrusion only protrudes into a middle region of the gate between uppermost and lowermost surfaces of the gate adjacent to respective interlayer insulating layers.

6. The vertical structure nonvolatile memory device of claim 5, wherein the recess has a vertical dimension that is greater than all of a remaining vertical dimension of the gate outside the recess.

7. The vertical structure nonvolatile memory device of claim 5, wherein the at least one recess and the at least one protrusion comprises first and second recesses and first and second protrusions disposed in first and second regions of the gate.

8. The vertical structure nonvolatile memory device of claim 1, the structure further comprising:
   a first interlayer insulating layer between immediately adjacent gates; and
   a second interlayer insulating layer in the recess between a gate electrode of the gate and layer.

9. The vertical structure nonvolatile memory device of claim 8, wherein the second interlayer insulating layer between the channel layer and the gate electrode has an etch selectivity different from that of the first interlayer insulating layer.

10. The vertical structure nonvolatile memory device of claim 8, wherein the first interlayer insulating layer is recessed from sides of the gates adjacent to the channel layer, in the same direction as the direction in which the at least one protrusion extends into the recess.

11. The vertical structure nonvolatile memory device of claim 1, wherein the gate comprises: a tunneling insulating layer, a charge storage layer and a blocking insulating layer that are sequentially stacked on the channel layer; and
   a gate electrode.

12. The vertical structure nonvolatile memory device of claim 11, wherein the charge storage layer comprises at least one selected from the group consisting of silicon nitride, polysilicon and fine particles of a conductor in insulator.

13. The vertical structure nonvolatile memory device of claim 11, wherein the tunneling insulating layer and the blocking insulating layer comprise materials having a larger bandgap than a material of the charge storage layer, and the blocking insulating layer has a dielectric constant higher than that of the tunneling insulating layer.

14. The vertical structure nonvolatile memory device of claim 1, wherein the channel layer comprises an annular pillar region, and the annular pillar region of the channel layer is filled with an insulating pillar.

15. The vertical structure nonvolatile memory device of claim 1, further comprising:
   a bit line coupled to one terminal of the memory cell string; and
   a common source line coupled to a terminal of the memory cell string opposite to the terminal coupled to the bit line.

16. The vertical structure nonvolatile memory device of claim 1, further comprising: a plurality of conductive lines disposed between adjacent memory cell strings; and
   spacers disposed on sidewalls of the memory cell strings to insulate the conductive lines from the memory cell strings.

17. A vertical structure nonvolatile memory device comprising:
   a plurality of transistors in a memory cell string, each including a respective gate electrode;
   a recess in at least one of the gate electrodes defining a portion of a non-planar surface of the at least one gate electrode; and
   a channel layer protruding into the recess and conformally on the portion of the non-planar surface.

18. The vertical structure nonvolatile memory device according to claim 17 wherein the at least one of the gate electrodes comprises only first and second selection transistors at both ends of the memory cell string.

19. The vertical structure nonvolatile memory device according to claim 17, wherein the recess comprises a first recess and the portion comprises a first portion, the device further comprising:
   a second recess in the least one of the gate electrodes including the at least one recess defining a second portion of the non-planar surface therein, wherein the channel layer protrudes into the second recess and is conformally on the second portion of the non-planar surface.

20. A system comprising:
   a memory including a vertical structure nonvolatile memory device comprising:
   a plurality of transistors in a memory cell string, each including a respective gate electrode;
   a recess in at least one of the gate electrodes defining a portion of a non-planar surface of the at least one gate electrode; and
   a channel layer protruding into the recess and conformally on the portion of the non-planar surface, the system further comprising:
   a processor configured to communicate with the memory via a bus; and
   an input/output unit configured to communicate with the bus.

* * * * *